(12) United States Patent
Schipani

(10) Patent No.: US 10,969,415 B2
(45) Date of Patent: Apr. 6, 2021

(54) RF ANTENNA SECTOR MONITORING DEVICE AND METHOD

(71) Applicant: WATERFORD CONSULTANTS LLC, Leesburg, VA (US)

(72) Inventor: Matthew Schipani, Reston, VA (US)

(73) Assignee: WATERFORD CONSULTANTS LLC, Leesburg, VA (US)

( * ) Notice: Subject to any disclaimer, the term of this patent is extended or adjusted under 35 U.S.C. 154(b) by 107 days.

(21) Appl. No.: 15/706,070

(22) Filed: Sep. 15, 2017

(65) Prior Publication Data
US 2018/0080966 A1 Mar. 22, 2018

Related U.S. Application Data

(60) Provisional application No. 62/395,705, filed on Sep. 16, 2016.

(51) Int. Cl.
*G01R 29/08* (2006.01)
*G01R 29/10* (2006.01)
(Continued)

(52) U.S. Cl.
CPC ..... *G01R 29/0871* (2013.01); *G01R 29/0878* (2013.01); *G01R 29/0892* (2013.01);
(Continued)

(58) Field of Classification Search
CPC .. G01R 29/10; G01R 29/0878; G01R 29/105; G01S 3/74; G01S 1/02; H04B 17/004; H04B 17/15–17/19; H04B 17/354; G08B 21/182; G08B 13/122–124; H01Q 9/34; H01Q 1/246; H01Q 1/44; H01Q 1/002
See application file for complete search history.

(56) References Cited

U.S. PATENT DOCUMENTS 6,111,503 A 8/2000 Javitt et al.
8,804,566 B1 8/2014 Singh et al.
(Continued)

FOREIGN PATENT DOCUMENTS

EP 0 982 793 3/2000
EP 1 432 155 6/2004
(Continued)

OTHER PUBLICATIONS

TG Cooper, Electromagnetic Fields Radio Transmitter Sites (Jun. 2007) (Year: 2007).*
(Continued)

*Primary Examiner* — Ricardo I Magallanes
(74) *Attorney, Agent, or Firm* — Greenblum & Bernstein, P.L.C.

(57) ABSTRACT

System and method for monitoring FCC compliance of a sector having at least one antenna, the sector being at least partially surrounded by a barrier comprising a plurality of barrier elements. The system includes a probe unit, mounted behind the at least one antenna, comprising an RF probe to measure RF emissions and at least one of: a receiver to receive a signal indicative of at least one of an opening of a service door in a vicinity of the sector and disturbance of at least one of the barrier elements; and a proximity sensor triggerable when an object moves within a too close zone to the probe unit.

11 Claims, 22 Drawing Sheets

(51) Int. Cl.
*H04B 17/354* (2015.01)
*H04B 17/30* (2015.01)

(52) U.S. Cl.
CPC .......... *G01R 29/10* (2013.01); *H04B 17/354* (2015.01); *H04B 17/30* (2015.01)

(56) References Cited

U.S. PATENT DOCUMENTS

| | | | |
|---|---|---|---|
| 2004/0121807 A1 | 6/2004 | Delbreil et al. | |
| 2004/0160362 A1 | 8/2004 | Lucuver | |
| 2004/0196813 A1 | 10/2004 | Ofek et al. | |
| 2005/0137786 A1 | 6/2005 | Breed | |
| 2006/0252390 A1* | 11/2006 | Bendov | H04B 17/103 455/117 |
| 2007/0202809 A1 | 8/2007 | Lastinger et al. | |
| 2008/0094212 A1* | 4/2008 | Breed | G08B 13/1663 340/541 |
| 2009/0073662 A1 | 3/2009 | Dahl | |
| 2013/0093625 A1 | 4/2013 | Smith | |
| 2013/0234883 A1* | 9/2013 | Ma | H01Q 3/267 342/174 |
| 2013/0281036 A1* | 10/2013 | Kolokotronis | H01Q 1/246 455/115.1 |
| 2014/0218255 A1 | 8/2014 | Sanford et al. | |
| 2016/0321890 A9* | 11/2016 | Woosnam | H04H 20/02 |
| 2017/0150306 A1* | 5/2017 | Lejeune, Jr. | H04W 4/021 |

FOREIGN PATENT DOCUMENTS

| | | |
|---|---|---|
| WO | 2013/123913 | 8/2013 |
| WO | 2016/064503 | 4/2016 |

OTHER PUBLICATIONS

Cooper et al., Occupational Exposure to Electromagnetic Fields at Radio Transmitter Site, Jun. 2007, [retrieved on Nov. 03, 2017]. Retrieved from Internet <URL: https://www.gov.uk/government/uploads/system/uploades/attachment_data/file/340121/HpaRpd026.pdf>.

International Search Report Forms PCT/ISA/220, PCT/ISA/210 and PCT/ISA/237 (dated Nov. 20, 2017).

Europe Search Report and Office Action conducted in counterpart Europe Appln. No. 17851613.4-1010/3513533 PCT/US2017051802 (dated Apr. 28, 2020).

* cited by examiner

RF ANTENNA SECTOR MONITORING DEVICE AND METHOD

CROSS-REFERENCE TO RELATED APPLICATIONS

The present application claims the benefit under 35 U.S.C. § 119(e) of U.S. Provisional Application No. 62/395,705 filed Sep. 16, 2016, the disclosure of which is expressly incorporated by reference herein in its entirety.

BACKGROUND OF THE INVENTION

1. Field of the Invention

System and method for systematic mapping of RF emitters and their emissions via on-site measurements at each location and the development of a mitigation plan to match the RF environment at the time of the site data collection.

2. Discussion of Background Information

Wireless carriers (Verizon, AT&T, Sprint, T-Mobile, etc.) are required by the FCC and other government agencies to comply with a myriad of regulations and guidelines pertaining to RF Emissions at their numerous transmission sites.

These regulations are met by the manual systematic mapping of RF emitters and their emissions through predictive evaluations and/or on-site measurements at each location and the development of a mitigation plan to match the RF environment at the time of the site data collection. A mitigation plan generally includes informational/warning signage and physical barriers to inform occupational persons and the general public who may visit the site of the existence of the RF emitters.

However, it has been found that the current system of mapping the RF environment on a yearly basis, as well as erecting static mitigations unfortunately present a myriad of problems. By way of non-limiting example, the Applicant has found that yearly mappings are only representative of the environment at a single point in time; mapping activities is expensive because RF sensing equipment is expensive, complicated and requires frequent calibration and maintenance; mitigations may not be appropriate at a later time and/or may not stay in place; FCC inspections do occur and can reveal deficiencies that have occurred in the mitigation; and deficiencies can result in substantial fines, landlord lease problems and unwanted public attention.

SUMMARY OF THE EMBODIMENTS

Embodiments are directed to a radio frequency infrastructure system and method. The system includes an array of integrated components, with hardware units and software, for implementing automated systematic processes for managing radio frequency exposure measurement, monitoring and mitigation in rooftop radio transmission sites.

In contrast to the known RF monitoring system, embodiments of the system allow carriers to conduct a survey of a wireless transmission site to get an initial compliance report and then maintain that report on a real time basis through real time monitoring and reporting. This monitoring and reporting is available on a continuous basis, i.e., 24 hours a day/7 days a week.

In embodiments, the system can be configured for real time monitoring and alerting of the RF environment for changes, real time monitoring and alerting of barriers and/or real time monitoring and alerting of lockable items. Additional or alternative embodiments can include an on-board camera for obtaining on-demand images, active proximity alarms when the primary field unit is approached and/or on demand certification report of RF environment and mitigations. Additional or alternative embodiments of the RF system can include a panoramic 360° camera arranged for obtaining on-demand images, active proximity alarms when the primary field unit is approached and/or on demand certification report of RF environment and mitigations.

Transmission sites to be monitored, according to embodiments, are generally arranged in sectors and each sector can contain a number of antennas. Embodiments of the system include field units placed at a site to facilitate data collection for the system. The primary field unit has a housing formed from a robust polymer, which allows for rugged, year-round, outdoor usage and which contains a variety of electronic subsystems to perform various tasks.

The primary field unit, which can be placed in the vicinity of the monitored sector, can include an RF probe positionable in front of the antennas of a respective sector. Further, a secondary probe, which can be positioned behind the antennas of the respective sector, may be coupled to the primary field unit, e.g., hardwired or wirelessly.

The primary field units include a number of hardware units, which can include a computer processing unit (CPU); an RF sensing unit; an RF probe, a communications unit; a power unit; an imaging unit; a memory/data retention unit; static mechanicals and/or dynamic mechanicals.

In embodiments, upon installation the system, the primary field unit begins recording RF measurements over a period of two weeks. These initial RF measurements can be used to establish an RF environment baseline with which the primary field unit's future RF measurements will be compared in order to establish whether there has or has not been any significant changes to the RF environment. Because the system is only interested in changes to the already studied environment, i.e., to the established baseline, accuracy of the readings is not critical to system performance that allows these units to operate for years at a time without requiring periodic calibrations.

Once the RF baseline has been established, the unit will continue to monitor and record RF measurements. These measurements can be stored locally on the device and transmitted, e.g., on a periodic basis, to a portal system via, e.g., hard wired Ethernet, Wi-Fi, an onboard cellular data device, or other suitable transmitter.

When the baseline measurements are exceeded for a significant, predetermined, period of time, the unit can be configured to immediately transmit that data and an alert notification to the portal system. Additionally, the alert notifications can also be sent to the customer's network operation center (NOC) through their own base station, e.g., via hardwired Ethernet or serial communications. From this point forward the alert event can be managed via the portal. For example, when a site is turned up for testing, a portal user can clear the alert status after the portal user determines that the situation has been mitigated, or does not require mitigation. The alert event can remain in the portal's activity log for that unit/site and the event will appear on certification documents as part of the site's history.

Other alerts may be handled in a similar manner. When a barrier is disturbed, e.g., removed, relocated, tipped over, knocked over, etc., the unit will sense the disturbance and transmit an alert notification. That alert can remain in the portal until cleared by the user. In the case of a barrier or generic sensor alert, the alert may remain active until manually cleared, even if the alert condition (knocked over barrier, open door sensor, offline unit) has been physically corrected in the field.

The unit can also monitor its physical surroundings by use of an ultrasound proximity sensor. When the sensor detects an object, person, or other item approaching the unit and the sector with which it is monitoring, the unit can sense and sound a high pitch high volume alert tone and/or activate an onboard Xenon strobe light for a specified period of time.

The unit can also accept requests from the portal system to take and transmit photographs of the situs of the unit. When a user of the portal requests a photo from the unit, the unit can activate its onboard camera and take a series of pictures covering a 360° field of view around the unit. Alternatively, the camera can be a separate element associated with the unit that is activatable by the user. The pictures can then be transmitted back to the portal for display to and review by the user and permanent storage therein.

Embodiments are directed to a system for monitoring FCC compliance of a sector having at least one antenna, the sector being at least partially surrounded by a barrier comprising a plurality of barrier elements. The system includes a probe unit, mounted behind the at least one antenna, comprising an RF probe to measure RF emissions and at least one of: a receiver to receive a signal indicative of at least one of an opening of a service door in a vicinity of the sector and disturbance of at least one of the barrier elements; and a proximity sensor triggerable when an object moves within a too close zone to the probe unit.

According to embodiments, the system can also include a secondary probe that is mounted in front of the at least one antenna and is coupled to the probe unit.

In accordance with other embodiments, the system may further include a portal system remote from the probe unit. The probe unit may further include a transceiver configured to transmit at least alerts to the portal system and to receive at least alert resets from the portal system. The at least alerts transmitted to the portal system can include measurements that exceed the baseline measurement by a predetermined amount for a predetermined period of time.

Embodiments are directed to a method for monitoring FCC compliance of a sector comprising at least one antenna, the sector being monitored by at least a probe unit and being at least partially surrounded by a barrier comprising a plurality of barrier elements. The method includes measuring, from a location behind the at least one antenna, RF emissions of the at least one antenna to establish a baseline measurement; measuring RF emissions to determine measurements exceeding the baseline by a predetermined amount for a predetermined period of time; and monitoring for at least one of an opening of a service door in a vicinity of the sector, a disturbance of at least one of the barrier elements and movement of an object within a too close zone to the probe unit.

According to embodiments, the method can further include measuring RF emissions from a location in front of the at least one antenna to establish a front baseline.

In accordance with still yet other embodiments of the present invention, the method may further include transmitting at least alerts to a portal system remote from the probe unit and receiving at least alert resets from the portal system. The at least alerts transmitted to the portal system can include the measurements exceeding the baseline by a predetermined amount for the predetermined period of time.

Other exemplary embodiments and advantages of the present invention may be ascertained by reviewing the present disclosure and the accompanying drawing.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
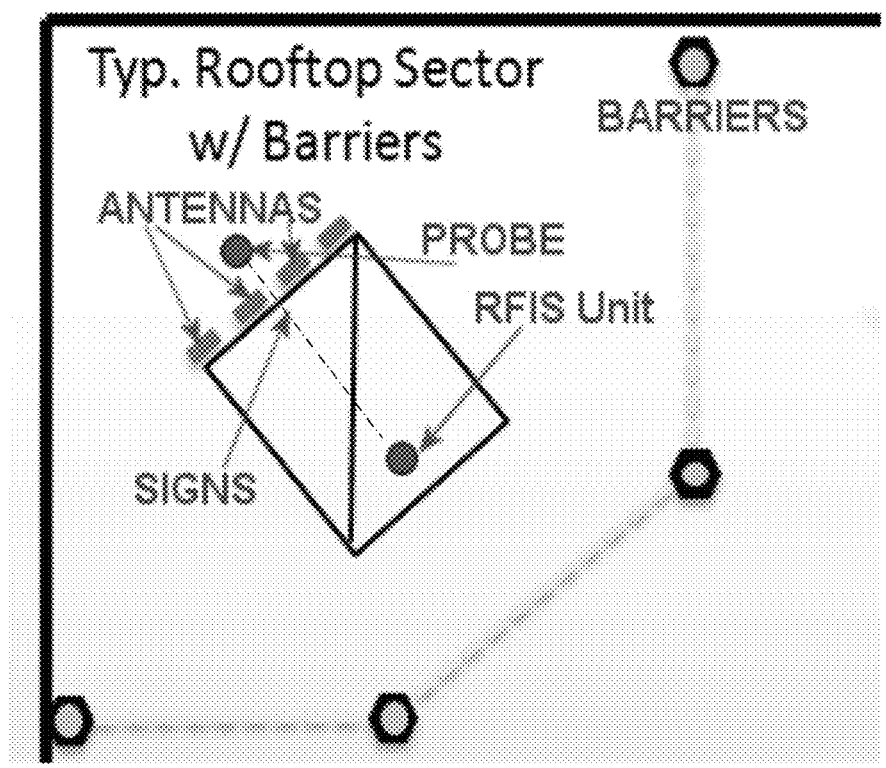
FIG. 1 illustrates an embodiment of a system arranged for monitoring an RF emission environment.

FIG. 1 includes an exemplary depiction of a transmission site, which can be a typical rooftop sector with barriers. A sector can include a number of antennas, e.g., RF antennas, as shown. The system for monitoring the sector/antennas can include a primary field unit and a secondary probe. In general, the primary field unit can include an RF probe, a camera, a communication unit, as well as hardware and software for operating and controlling the unit, and the secondary probe can include another RF probe. The primary unit can also include a camera, e.g., an on-board panoramic 360° camera, or a separate camera arranged in a vicinity of the primary unit activatable by the system and/or primary field unit. Preferably, the system is provided for FCC and FAA regulatory compliance, engineering, site development, and a host of unique software-related offerings that service the wireless industry. This system can be advantageous to customers/clients, including the industry's leading carriers, tower and structure owners, engineering and site acquisition firms, as well as most local, state and federal government organizations.

The primary field unit/secondary probe may be understood as primary components of the system. The primary field unit/secondary probe can be located in a vicinity of the sector to be monitored so that the primary field unit is arranged/mounted behind the antennas of the monitored sector and the secondary probe is arranged/mounted in front of the antennas of the monitored sector. Further, the secondary probe can be connected the primary field unit via, e.g., a wired or wireless connection, so that the RF readings taken by the secondary probe are transmitted to the primary field unit for analysis and transmission. Under certain circumstances, the wired connection may be preferable to reduce over the air transmissions in the vicinity of the monitored sector.

FIGS. 2-14 illustrate components for the primary field unit and/or secondary probe. The illustrated components are formed from a robust polymer housing, e.g., carbon fiber impregnated polylactic acid (PLA), designed for rugged, year-round, outdoor usage and contains a variety of electronic subsystems performing various tasks. Moreover, the construction of the housings for the primary field unit and secondary probe use many of the same structural elements, thereby reducing costs.

Figure 3:
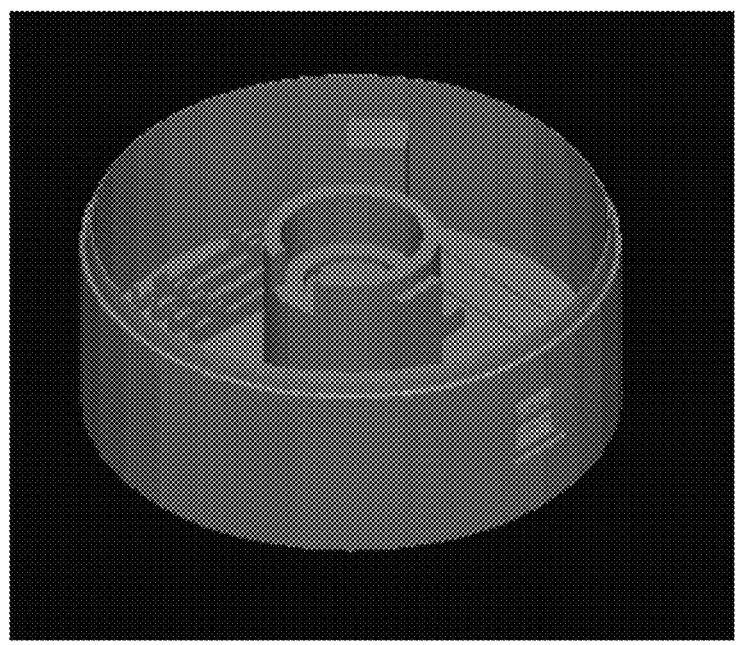
FIG. 3 illustrates an embodiment of a base for a primary field unit and/or secondary probe of the system.
Figure 2:
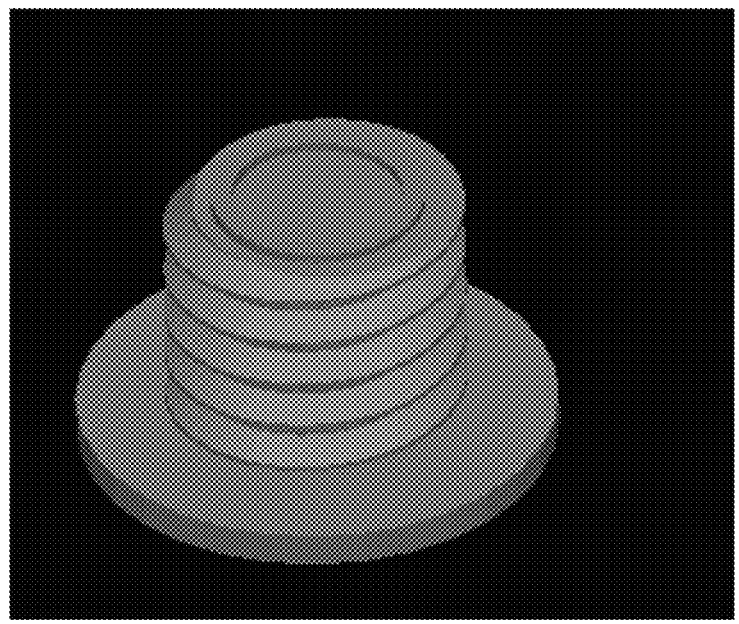
FIG. 2 illustrates an embodiment of a mounting screw for a primary field unit and/or secondary probe of the system.
Figure 4:
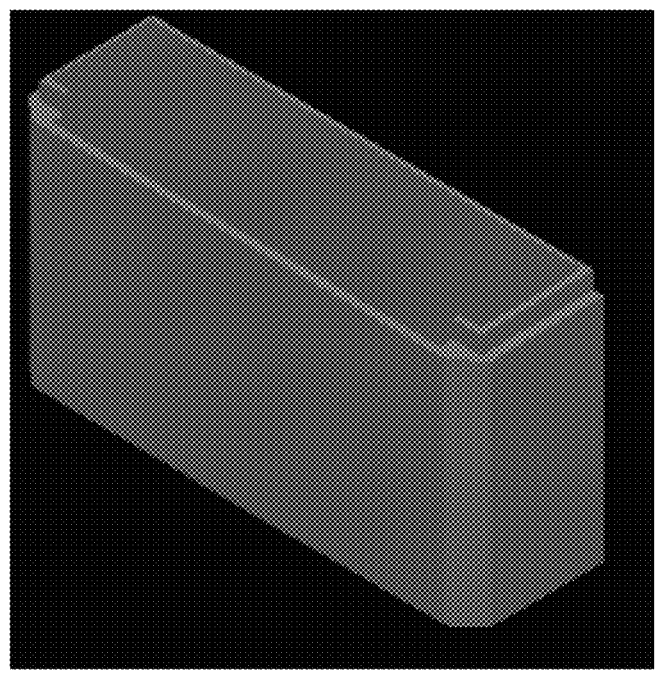
FIG. 4 illustrates an embodiment of an RF sensor box for a primary field unit and/or secondary probe of the system.
Figure 5:
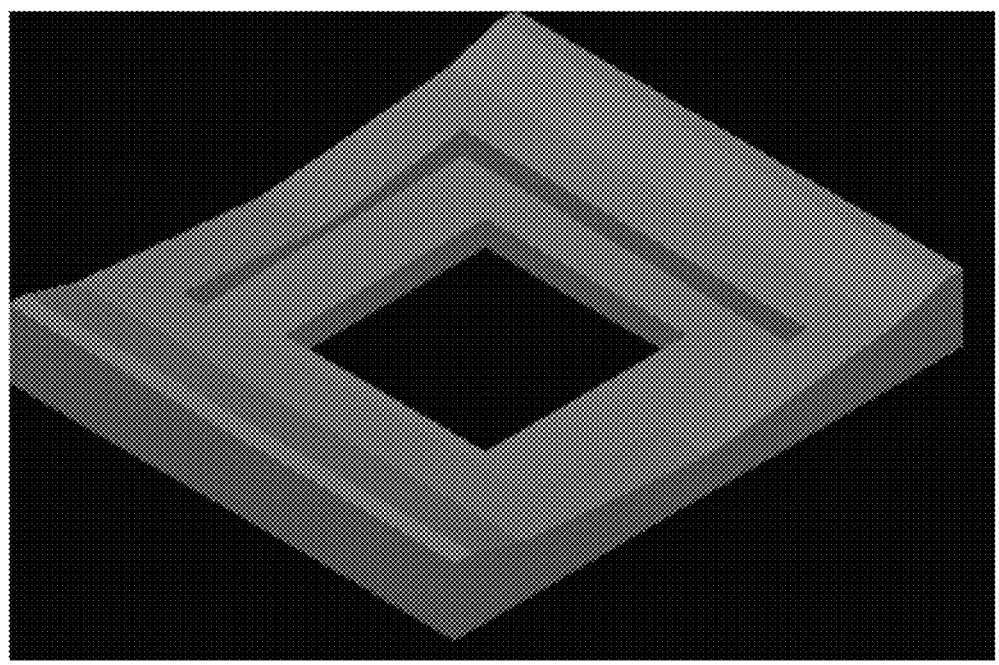
FIG. 5 illustrates an embodiment of a display orifice for a primary field unit and/or secondary probe of the system.
Figure 6:
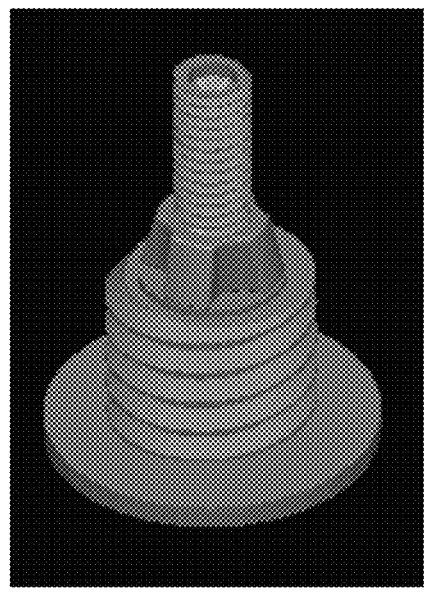
FIG. 6 illustrates an embodiment of a power screw for a primary field unit and/or secondary probe of the system.

FIG. 2 shows a mounting screw that is glued or screwed onto a platform, sled frame or tripod within the carrier's lease space. This mounting screw can be utilized in both the primary field unit and the secondary probe. FIG. 3 shows a base having a central connector on the bottom surface to screwably connect to the mounting screw. As the base is screwed tighter onto the mounting screw, the carbon fibers impregnated in the PLA make unscrewing difficult, thus, increasing the security of the mounting of the primary field unit/secondary probe. This base can be utilized in both the primary field unit and the secondary probe. Within the base is an area configured to receive an RF sensor box, which is shown in FIG. 4. The RF sensor box contains sensors of an RF sensing unit and the box is covered with a copper foil, which forms a Faraday cage to protect the sensors from any interference. This RF sensor box can be utilized in both the primary field unit and the secondary probe. Further, a central cylinder within the base is provided with a notch to accommodate/receive wires for connecting the RF sensors to an RF probe (described below). On the side wall of the base is a rectangular through hole into which an orifice cover, as shown of FIG. 5, is positionable. Through this orifice, a digital display, e.g., LED, LCD, etc., can be viewed on both the primary field unit and the secondary probe. The side wall of the base can also include another through opening to receive the power screw shown in FIG. 6. Through the power screw opening, wires from an external power source can be received within the base for connection to a power source for powering the components within the primary field unit and the secondary probe.

The base can also be configured to receive various components for operating the primary field unit. In particular, the base can house at least one tangible storage medium, such as a non-transitory medium, which can include a solid state memory, a random access or read only memory. The base can also house a central processing unit configured to execute instructions stored on the tangible storage medium within the base or stored on an external drive or server. A communications unit can also be housed within the base to control transmission of the monitored/collected data to a remote server or user portal monitored by service personnel and receipt of instructions from the remote server or the service personnel via the user portal and/or to control transmission of the monitored/collected data to the client/service carrier of the monitored sector through the client's/service carrier's network operation center (NOC) via through their own base station and receipt of instructions from the client/service carrier of the monitored sector through the client's/service carrier's NOC via through their own base station.

An imaging unit configured to control operation of a camera (discussed below), can be housed within the base. The camera, which can be located in or separate from the primary field unit, can be remotely operated by service personnel via the user portal and/or by the client/service carrier of the monitored sector to takes a series of photographs of the situs of the primary field unit to show, e.g., a 360° view of the situs so that all mitigations, such as signage, barriers, etc., are visible.

Also housed within the base can be a proximity sensor, e.g., an ultrasonic proximity sensor, to sense the approach of a person or object and to issue an alert, such as an audible and/or visible alarm. By way of example, the base can house a Xenon strobe light visible from outside of the housing that can be triggered by the person or object moving within a predetermined distance of the primary field unit or the secondary probe. Further, the housing can include a speaker to issue a high pitch, high volume audible alarm in conjunction with or as an alternative to the visible alarm. An alert can also be forwarded to the service personnel and/or the client/service carrier of the issuance of the proximity alarm, so that remedial action can be taken and/or the alarm can be remotely reset.

Figure 7:
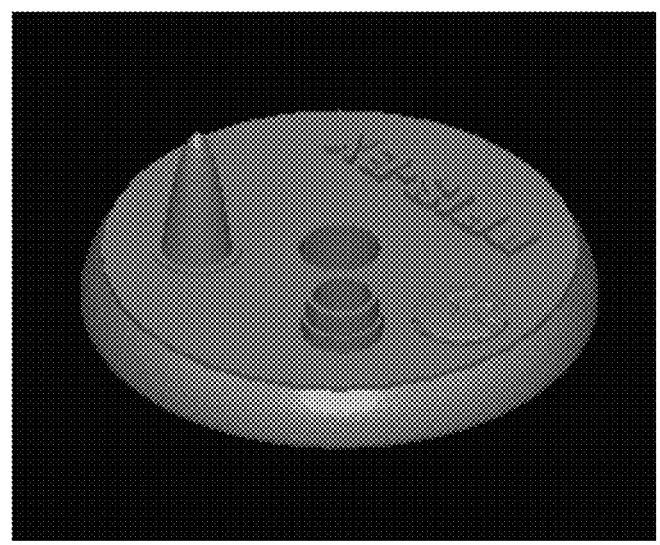
FIG. 7 illustrates an embodiment of a cover for a primary field unit and/or secondary probe of the system.

The cover shown in FIG. 7, which can be used by both the primary field unit and the secondary probe, closes off the base to protect the components housed within the base. An inside surface of the cover has a hollow cylindrical portion sized to have an interference fit with the central cylinder in the base. Further, a through hole in the center of the cover communicates with the hollow cylindrical portion so that the wires to the RF probe can extend through the cover. Further, a downward extending lip on the periphery of the cover is configured for an interference fit with the base. The cover also includes an upwardly extending conical portion that is offset from the center, which covers a transceiver antenna or cellular antenna of the communications unit. Also offset from the center is another through hole surrounded by an upwardly extending connector.

Figure 8:
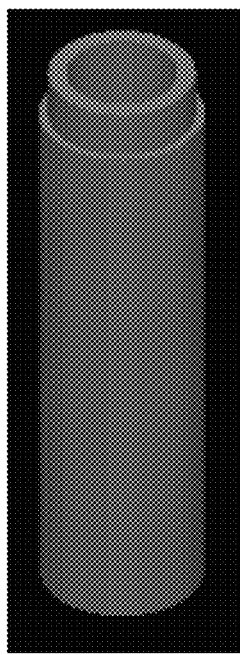
FIG. 8 illustrates an embodiment of a probe bottom segment for a primary field unit and/or secondary probe of the system.
Figure 9:
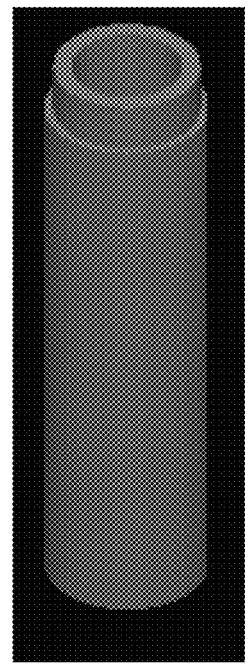
FIG. 9 illustrates an embodiment of an optional probe extension for a primary field unit and/or secondary probe of the system.
Figure 10:
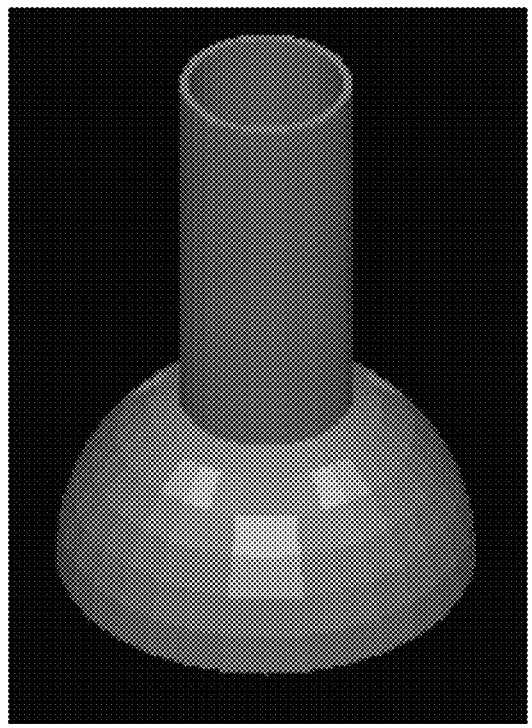
FIG. 10 illustrates an embodiment of a probe antenna bottom case for a primary field unit and/or secondary probe of the system.

As both the primary field units and the secondary probes are provided with RF probes, a bottom end of the probe bottom segment shown in FIG. 8 can be dimensioned for an interference fit with the center through hole in the cover. The probe antenna bottom case shown in FIG. 10 can be arranged atop the probe bottom segment, again with an interference fit, or, if greater height is desired for locating the RF probe at an appropriate height for monitoring the sector, one or more optional probe extensions, which is shown in FIG. 9, can be arranged between the probe antenna bottom case and the probe bottom segment. The probe seal shown in FIG. 11 can be inserted onto the top of the probe antenna bottom case, and the probe top shown in FIG. 12 can be positioned onto the probe seal.

For the primary field units that include a camera, a housing for the camera can extend from the through hole in the cover surrounded by the upwardly extending connector. In particular, the camera turret housing shown in FIG. 14 can be inserted over the upwardly extending connector with an interference fit. For secondary probes not including a camera, the camera orifice shown in FIG. 13 can be inserted onto the upwardly extending connector as a cover to close off the interior of the base from the outside environment.

Figure 12:
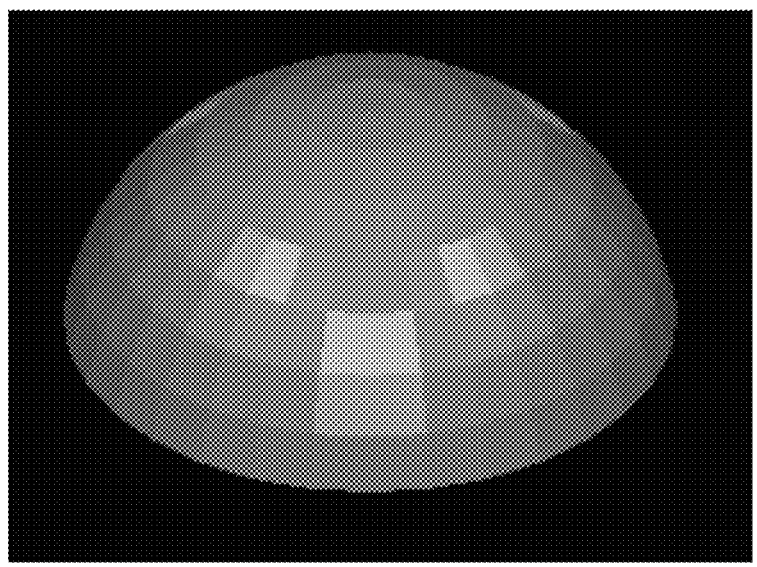
FIG. 12 illustrates an embodiment of a probe top for a primary field unit and/or secondary probe of the system.
Figure 11:
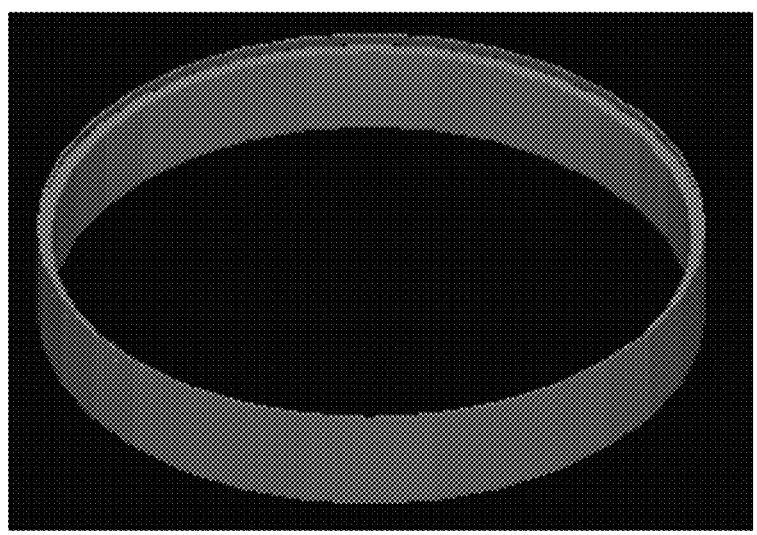
FIG. 11 illustrates an embodiment of a probe seal a primary field unit and/or secondary probe of the system.
Figure 14:
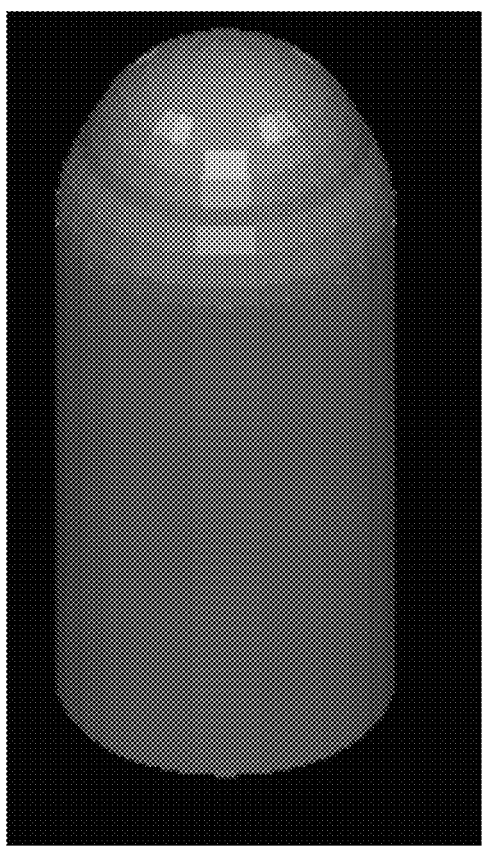
FIG. 14 illustrates an embodiment of a camera turret for a primary field unit of the system.
Figure 13:
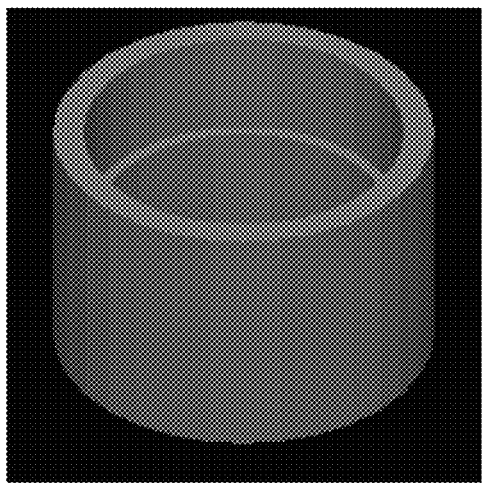
FIG. 13 illustrates an embodiment of a camera orifice for a primary field unit of the system.
Figure 28:
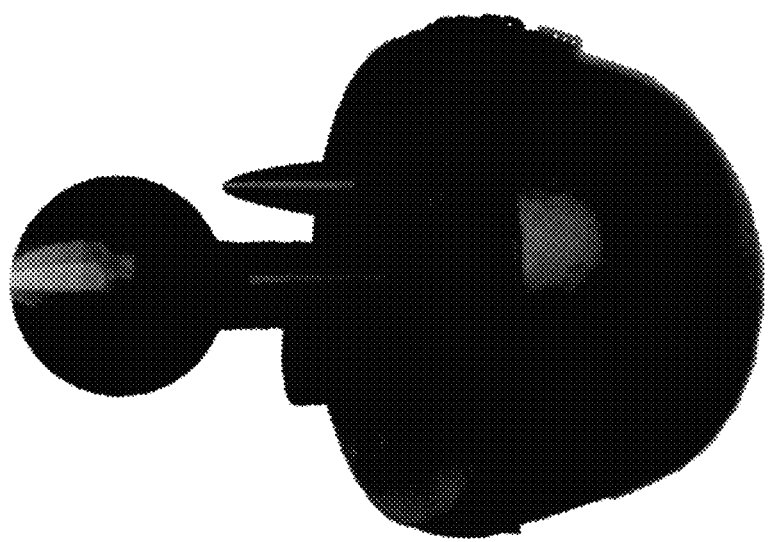
FIG. 28 shows an exemplary construction of the secondary probe.

Further, a physical RF probe/antenna is housed within the probe top of FIG. 12 (not shown), and is connected to the RF sensing unit via wires extending from the RF sensing unit through the probe bottom segment, the probe extension (if applicable) and the probe seal to the physical RF probe/antenna. FIG. 28 shows an exemplary embodiment of the primary or secondary probe, where the camera orifice is affixed in place of the camera turret.

Moreover, the camera, which can be housed within the camera turret housing or can be arranged external to the primary field unit, can be connected to a rotatable mount and associated linkage so that, via activation of a standard servo motor and a gear train, the rotatable mount can be rotated through 360°, while the camera takes a series of pictures of the situs. These pictures may then be transmitted back via the portal system for display to the user personnel and for permanent storage therein.

Further, the system can include connecting sensors to the barriers, signage and/or access doors in the vicinity of the monitored sector. By way of non-limiting example, the barriers and/or signage can utilize a series of switches that are wired together. More particularly, the barriers can be monitored by normally open pressure switches in a base of each barrier or barrier element and a continuity sensor monitoring a thin wire threaded through the chain connecting the barrier stanchions to each other within a segment of barrier stanchions. Further, the last switch can be coupled to a transmitter, e.g., a ZigBee transmitter, for alerting the system via a corresponding receiver housed within the base of the movement/disturbance to the barriers. Each stanchion of the barriers and/or signage can be placed over one of the sensors, e.g., a pressure switches, that will switch from a normally closed position to an open or vice versa, when the stanchion is moved/disturbed. The change in state of the pressure sensor can activate the transmitter to alert the system of the change of condition in the barriers. In response to this alert, the strobe light and/or the audible alarm can be triggered for a local alarm and/or an alert can be forwarded to the service personnel and/or the client/service carrier of the movement/disturbance of the barrier/signage, so that remedial action can be taken and/or the alarm can be remotely reset. Moreover, as the sectors may be located in areas near the general public, and as the local alarms may disturb the locals, it may be advantageous to merely alert the user personnel of the alarm tripping so that no local alarm is triggered.

The system can include connecting sensors to access door in the vicinity of the monitored sector. By way of non-limiting example, the sensors can be, e.g., magnetic proximity switches or Hall effect sensors that attach to the door and frame so as to active an alarm when the sensor on the door separates from the sensor on the door frame. Upon sensing a change in state of the door sensor, an RF receiver, e.g., a RF ZigBee receiver, can be housed within the base to receive a signal from the door sensor indicative of a door open condition to issue an alert to the system that an access door has been opened. In response to this alert, the strobe light and/or the audible alarm can be triggered for a local alarm and/or an alert can be forwarded to the service personnel and/or the client/service carrier of the movement/disturbance of the access door, so that remedial action can be taken and/or the alarm can be remotely reset. As with the barrier sensors, as the sectors may be located in areas near the general public, and as the local alarms may disturb the locals, it may be advantageous to merely alert the user personnel of the alarm tripping so that no local alarm is triggered.

An installation procedure for the system can include, securing the primary field unit to sled or building using the mounting screw located behind the antennas of the sector to be monitored. Thereafter, the unit can be connected to an external power source to power the unit. The secondary probe can then be mounted in front of the antennas of the sector and coupled to the primary field unit, e.g., hardwired or wirelessly. Next the primary field unit is registered with the portal system via the communications unit. The registration can occur through a wired, wireless or cellular transmission so that the monitoring of the antenna sectors and control of the primary field unit can be achieved by user personnel through the portal system.

Once connected to the portal, it may be advantageous to test the proximity alarms in the primary field unit and in the secondary probe. In this way, it may be ensured that the proximity alarms are successfully triggered locally and that the user personnel are alerted to the triggering of the alarms through the portal system. It can also be advantageous to then install the barriers over the barrier sensors, which can be connected in a series string, and test the sensors by moving a barrier to ensure actuation of a local alarm and actuation of an alarm to the user personnel through the portal system. Finally, door sensors can be installed on the doors and tested to ensure actuation of a local alarm and actuation of an alarm to the user personnel through the portal system.

After the initial set up of the system, the system, via the primary field unit and secondary probe, begin recording RF measurements over a learning period of, e.g., two weeks. These initial measurements are used to establish a baseline for the RF emission environment of the sector's antennas, to which future measurements will be compared to determine whether there has been or has not been any significant changes to the RF emission environment. Because the system is only interested in changes to the already established baseline environment, the accuracy of the readings taken is not critical to system performance which allows these units to operate for years at a time having no need for periodic calibrations.

Therefore, once the RF baseline has been established, the primary field unit will continue to monitor and record RF measurements. Measurements are stored locally on the data storage medium and can be transmitted via the communication unit to the portal system on a periodic basis via hard wired Ethernet, Wi-Fi, or an onboard cellular data device.

When the baseline measurements are exceeded for a significant, predetermined, period of time, e.g., 5 db for ½ hour, the primary field unit can immediately transmit that data and an alert notification to the user personnel via the portal system. Alert notifications can also be sent to the client's/service carrier's NOC via their own base station via hardwired Ethernet or serial communications. From this point forward the alert event can be managed via the portal system. After the user personnel determines that the situation has been mitigated, or does not require mitigation, e.g., the site was turned up for testing, etc., the user personnel can clear the alert status through the portal system. However, the alert event can remain in the portal system's activity log for that unit/site and the event will appear on certification documents as part of the site's history.

Other alerts can also be handled in a similar way. When a barrier is disturbed, e.g., removed, relocated, tipped over, etc., the primary field unit can transmit an alert notification and that alert will remain in the portal system until cleared by the user. In the case of a barrier or generic sensor alarm, the alert remains active until manually cleared even if the alert condition (knocked over barrier, open door sensor, offline unit) has been physically corrected in the field.

Figure 15:
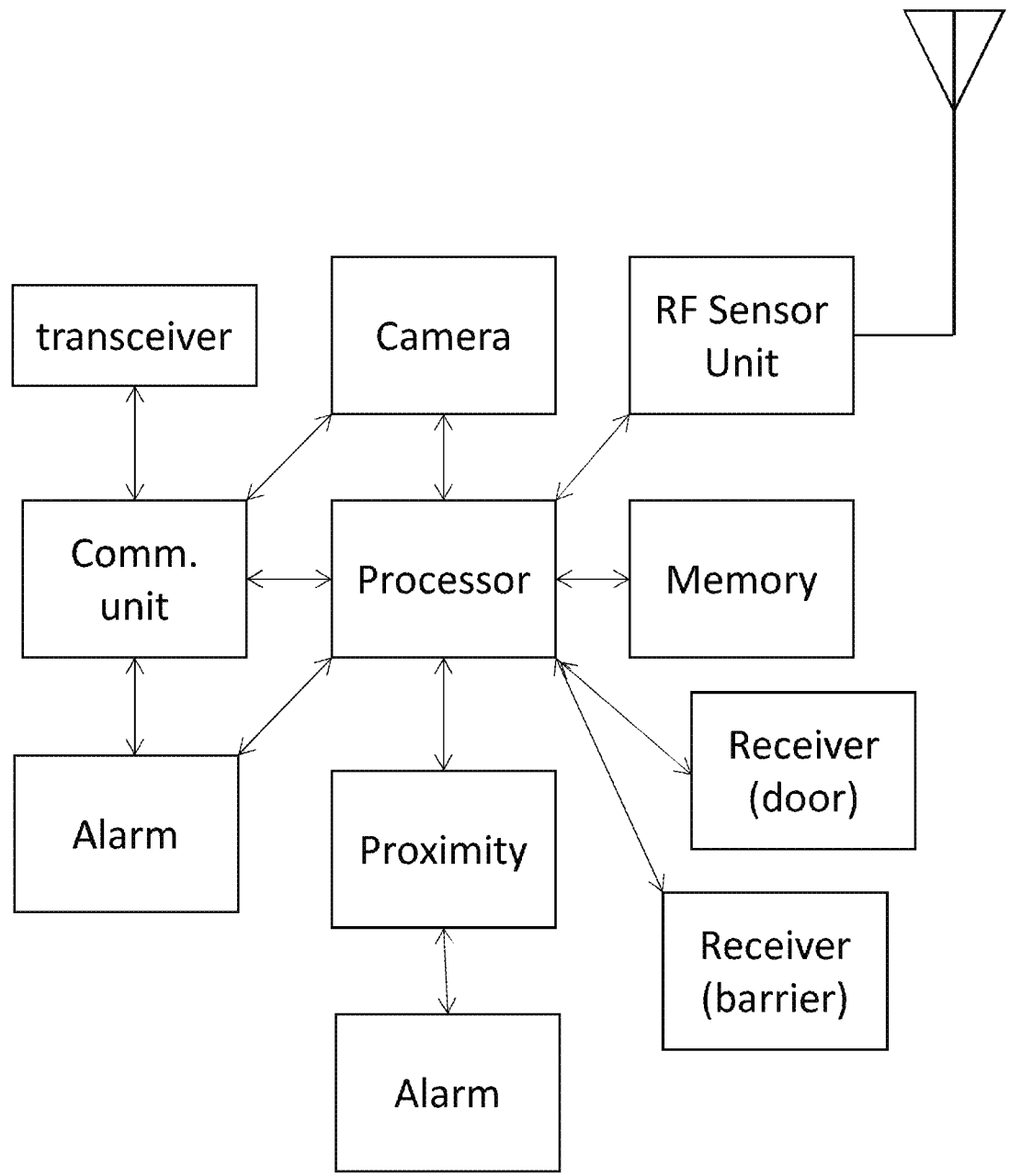
FIG. 15 illustrates an embodiment of the components of the system.
Figure 16:
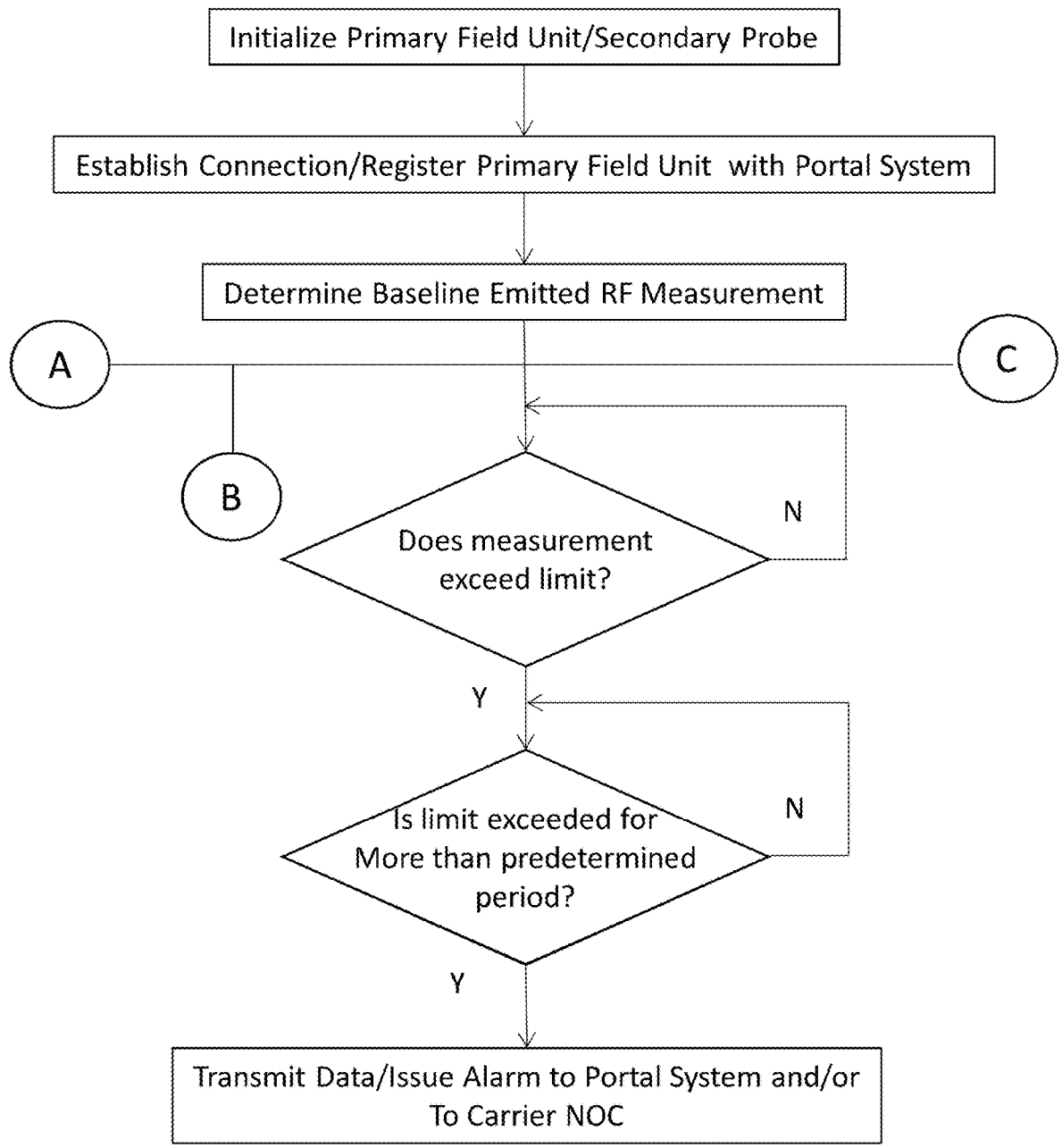
FIGS. 16-19 illustrate a flow diagram of an exemplary operation of the system.
Figure 17:
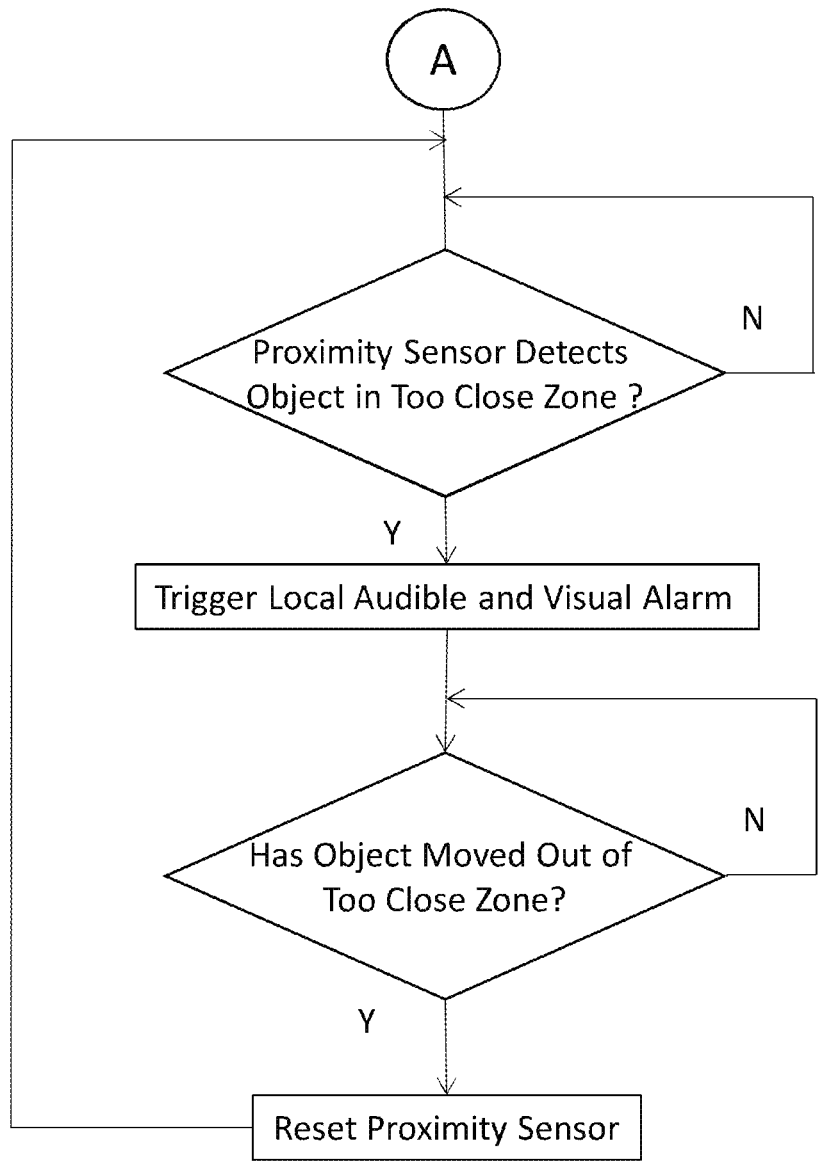
Figure 18:
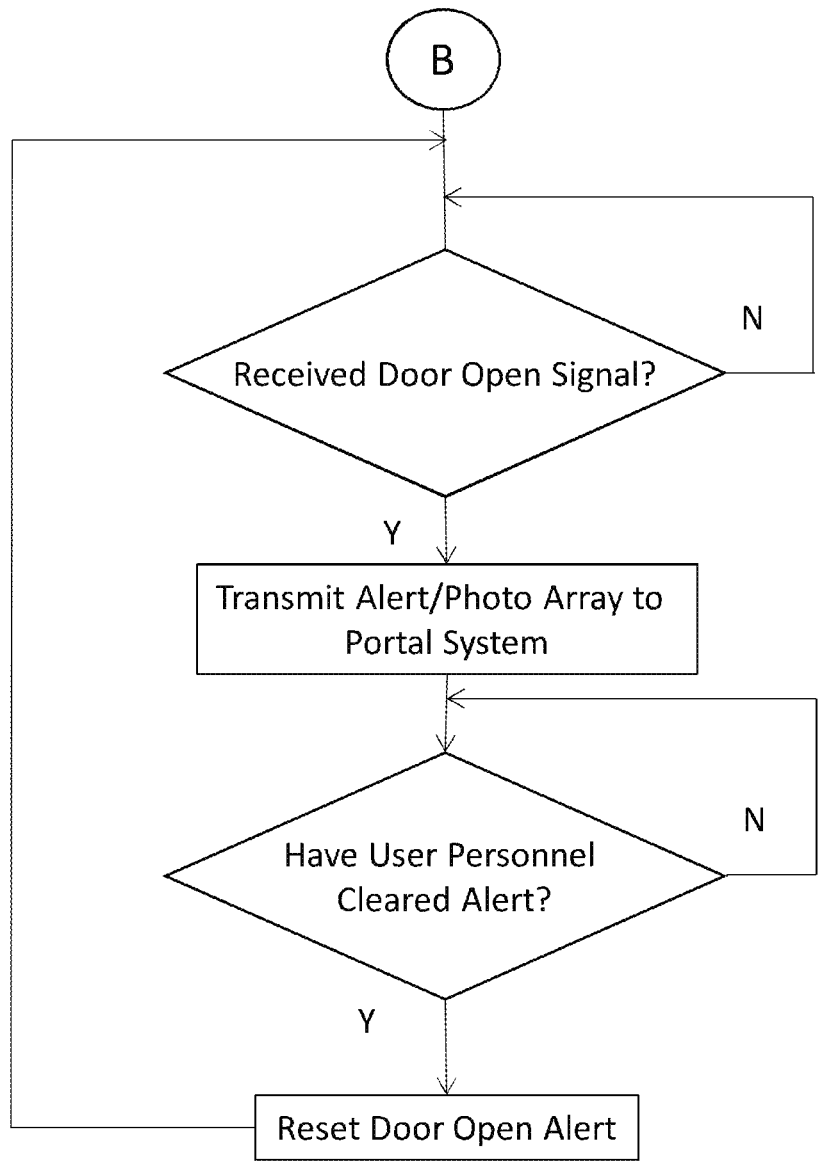
Figure 19:
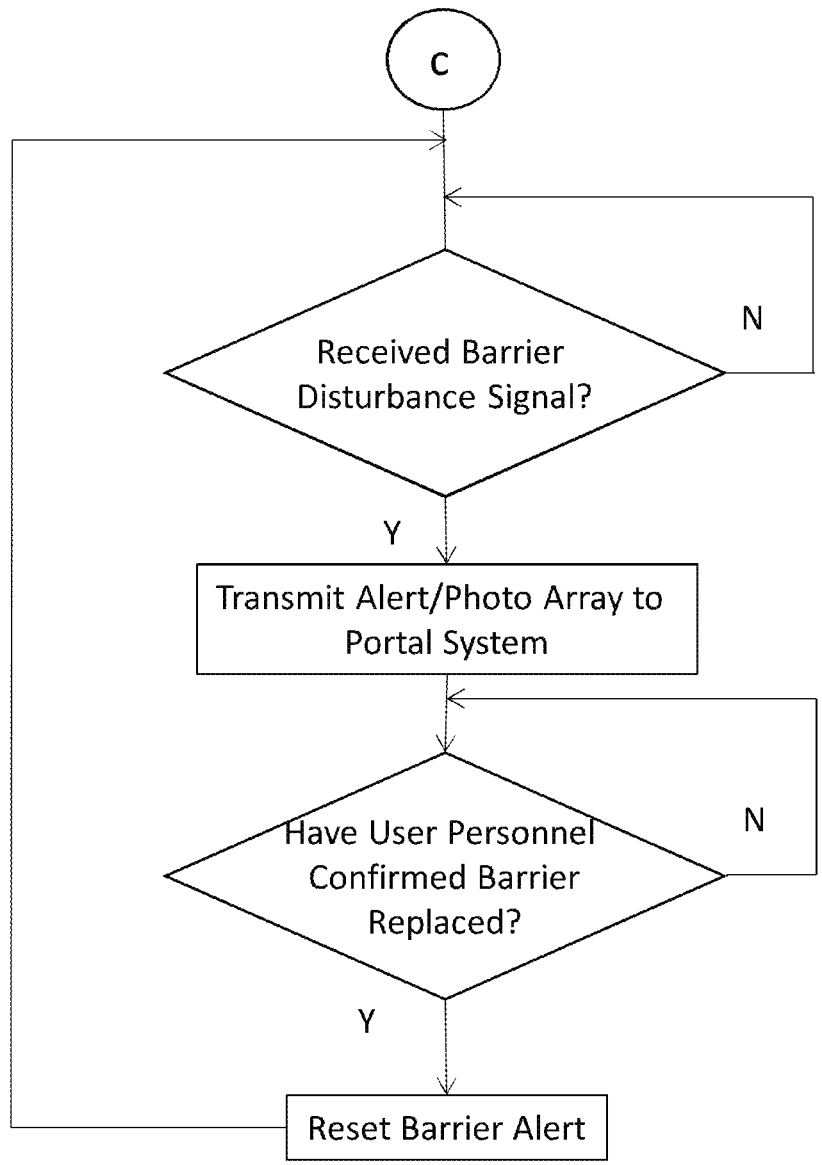

FIG. 15 illustrates an exemplary embodiment of the components for operation of the RF antenna sector monitoring system. In particular, the components can be controlled by a processor, which is connected to at least one tangible storage medium memory storing instructions for operating the RF sector monitoring system. The at least one tangible storage medium, can be a non-transitory medium, such as a magnetic medium such as a disk or tape; a magneto-optical or optical medium such as a disk; or a solid state medium such as a memory card or other package that houses one or more read-only (non-volatile) memories, random access memories, or other re-writable (volatile) memories. The at least one tangible storage medium can contain a set of instructions to be executed by the processor in order to control the components and perform the desired monitoring of the RF antenna sector and can receive data from the components, e.g., via the processor. An RF sensor unit coupled to an RF antenna or receiver is coupled to send and receive data from the processor. In particular, the RF antenna receives RF radiation emitted from/within the monitored segment and transmits the data to the processor to store the information and/or to alert a user if the RF measurement exceeds a predetermined amount or an established baseline level.

In embodiments, a receiver can be coupled to a door, window and/or other opening or passage for a human or animal to be permitted ingress or egress to a vicinity of the monitored sector. The receiver, which receives signals from sensors monitoring the door, window and/or other opening or passage, can constantly send a signal to the processor that is evaluated by the processor to determine when the door, window or other opening and/or passage is opened or when movement through the door, window or other opening or passage is sensed. Alternatively, the receiver can receive a signal indicative of a change of state, i.e., when the door, window and/or other opening of passage changes from a closed to an open condition, and forward this change of state to the processor for evaluation.

In embodiments, a receiver can be coupled to a barrier delimiting an outer perimeter of a predefined area for the monitored sector and/or signage posted to alert people that the area is monitoring RF radiation in the sector. As discussed above, the barriers and/or signage can utilize a series of switches that are wired together. More particularly, the barriers can be monitored by normally open pressure switches in a base of each barrier or barrier element and a continuity sensor monitoring a thin wire threaded through the chain connecting the barrier stanchions to each other within a segment of barrier stanchions. Further, the last switch can be coupled to a transmitter, e.g., a ZigBee transmitter, for sending a signal to the receiver of any movement/disturbance to the barriers and/or signage. Each stanchion of the barriers and/or signage can be placed over one of the sensors, e.g., a pressure switches, that will switch from a normally closed position to an open or vice versa, when the stanchion is moved/disturbed. The receiver can receive a signal indicative of a change of state of the pressure sensor, i.e., indicative of movement of the barriers and/or signage, and forward this change of state to the processor for evaluation.

In embodiments, a proximity sensor can be coupled to the processor to sense movement or presence of an object or a human or animal within in a predefined vicinity of the monitored sector, the primary field unit and/or the secondary probe. The proximity sensor can activate an alarm or send a signal to the processor for evaluation. The alarm can be automatically turned off when the proximity sensor determines that the movement or presence of the object, human or animal is no longer sensed or the alarm can remain on until a user manually resets the alarm.

A communication unit is coupled to send and receive data from the processor. In embodiments, when the processor's evaluation of data from the RF sensor unit, the door receiver, the barrier receiver, and/or the proximity sensor determines that an alarm condition has occurred, the processor can activate a local alarm, such as a strobe light and/or audible alarm, to warn locals of the alarm condition. Further, the processor can activate the communication unit to transmit via a transceiver, the alarm condition to user personnel through a wired or wireless connection, e.g., via the portal system.

A camera, which can be on-board the primary field unit or the secondary probe or which can be arranged in the monitored sector, can be arranged to capture a panoramic 360° view of the monitored sector, when instructed to do so. In this regard, when the processor evaluates an alarm condition, the camera can be instructed to take a picture of the sector and the picture can be transmitted to user personnel via the communication unit and the transceiver. Further, the user personnel, via instructions transmitted to the processor through the transceiver and the communication unit, can request the camera to take a picture of the monitored sector. In this way, the user personnel can evaluate the conditions of the monitored sector at the time of the alarm and a current condition to determine whether the alarm can be cleared.

FIGS. 16-19 illustrate a flow diagram of an exemplary operation of the system. By way of non-limiting example, in operating the RF antenna sector monitoring device, the primary field unit and secondary probe can be initialized. This initialization can include the user providing authorization credentials to ensure that the user is authorized to operate the monitoring device. When initialized, the primary field unit can be registered with and establish a connection, e.g., wired or wireless, to the portal system. As part of the initialization, a primary field unit begins recording RF measurements over a period of time, e.g., two weeks, to establish an RF environment baseline with which the primary field unit's future RF measurements will be compared in order to establish whether there has or has not been any significant changes to the RF environment.

Once the RF baseline has been established, the unit will continue to monitor and record RF measurements. While monitoring and recording these RF measurements, a determination is made whether the measurement exceeds a predefined limit. If no, the process returns to determine whether the measurement exceeds the predefined limit. If the RF measurement exceeds the predefined limit, a determination is made whether the limit has been exceeded for more than a predetermined period of time. If the predetermined period has not yet elapsed, the process continued monitoring the time until the time limit is reached or the RF measurement no longer exceeds the predefined limit. When the RF measurement exceeds the predefined limit for a time period greater than the time limit, data is transmitted and/or an alarm is issued to the portal system and/or to a network operation center (NOC) of a customer or carrier.

Concurrently with the monitoring of the RF measurement, the process can also determine whether a foreign object, including a human or animal, is too close to the monitored sector or zone. If no foreign object is detected within the monitored sector, the process continues monitoring. When a foreign object is detected within the monitored sector, an audible and or visual proximity alarm can be triggered. Once the alarm is triggered, the process determines whether the foreign object remains within the monitored sector. If the object remains, the proximity alarm continues. However, when a determination is made that the object has moved out/been removed from the monitored sector, the proximity alarm can be reset.

The process can also concurrently monitor the door sensors associated with the access doors to determine whether the doors have been opened. The door sensor is monitored until a door open signal is received. Upon receiving the door open signal, an alert/alarm and/or a photo array can be transmitted to the portal system. As merely closing the door does not ensure that unauthorized individuals are not present near the monitored sector, the photo array can assist personnel using the portal system to be sure that no unauthorized individuals remain near the monitored sector. When personnel are sure no unauthorized individuals remain, the alert/alarm can be cleared. Moreover, once the alert/alarm is cleared, the door sensors can be reset.

The process can also concurrently monitor whether the barriers and/or signage has been disturbed. In this regard, when a disturbance signal indicative of movement of the barriers and/or signage is received, an alert/alarm and/or a photo array can be transmitted to the portal system. When personnel have confirmed that the barriers and/or signage have been replaced to their normal positions, the barrier sensors can be reset.

Figure 20:
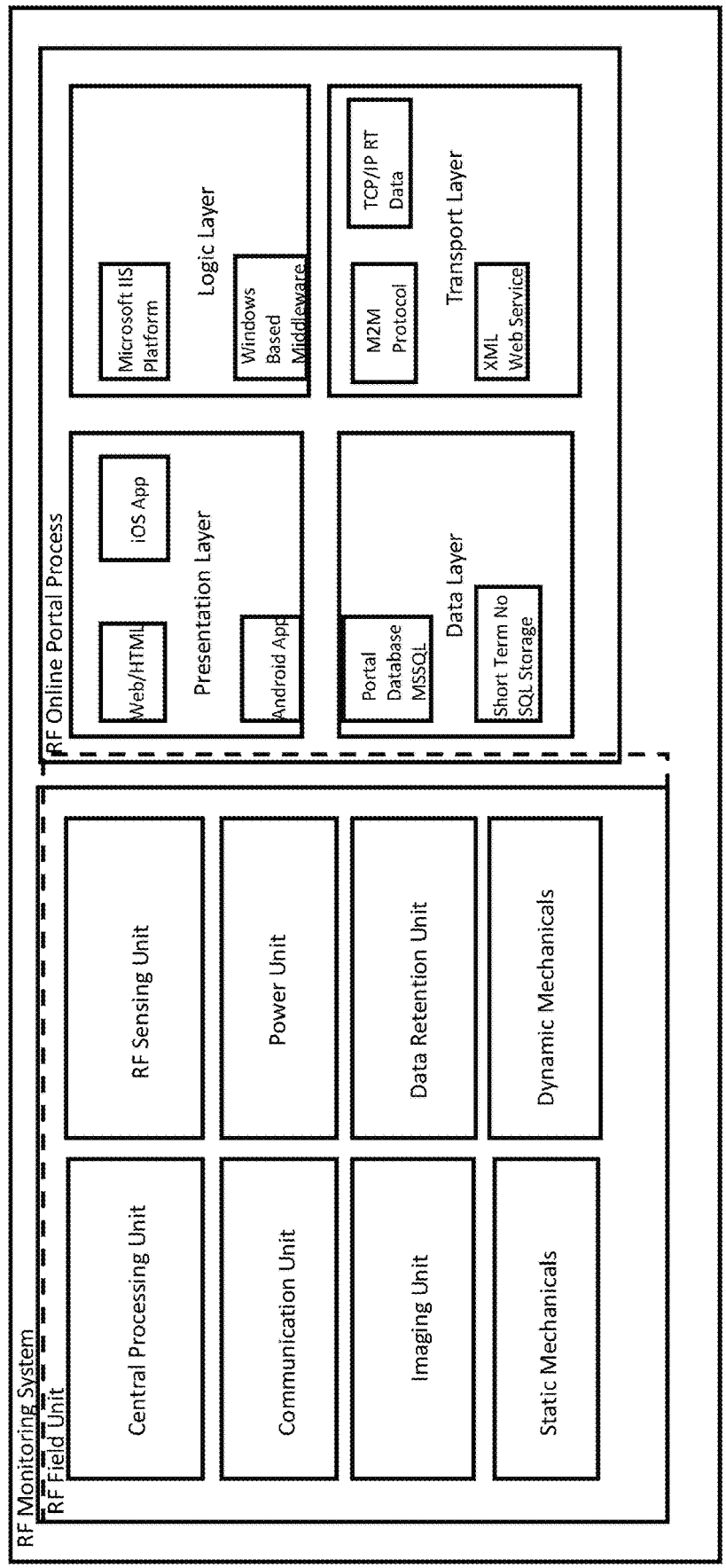
FIG. 20 illustrates a block diagram of the system components.

FIG. 20 illustrates a block diagram of the system components for the RF antenna sector monitoring system. Schematically, the system components can be understood to include a field unit and an online portal process. As has been discussed above, the field unit can include an interconnection between a central processing unit, an RF sensing unit, a communication unit, a power unit, an imaging unit, a data retention unit, static mechanicals and dynamic mechanicals. the online portal process includes a presentation layer, which includes a web/HTML module, an iOS App module and an Android App module, a logic layer, which includes a Microsoft IIS platform and Windows based middleware, a data layer, which includes portal database MSSQL and short term SQL storage, and a transport layer, which includes M2M protocol, TCP/IP RT data and an XML web service.

Figure 21:
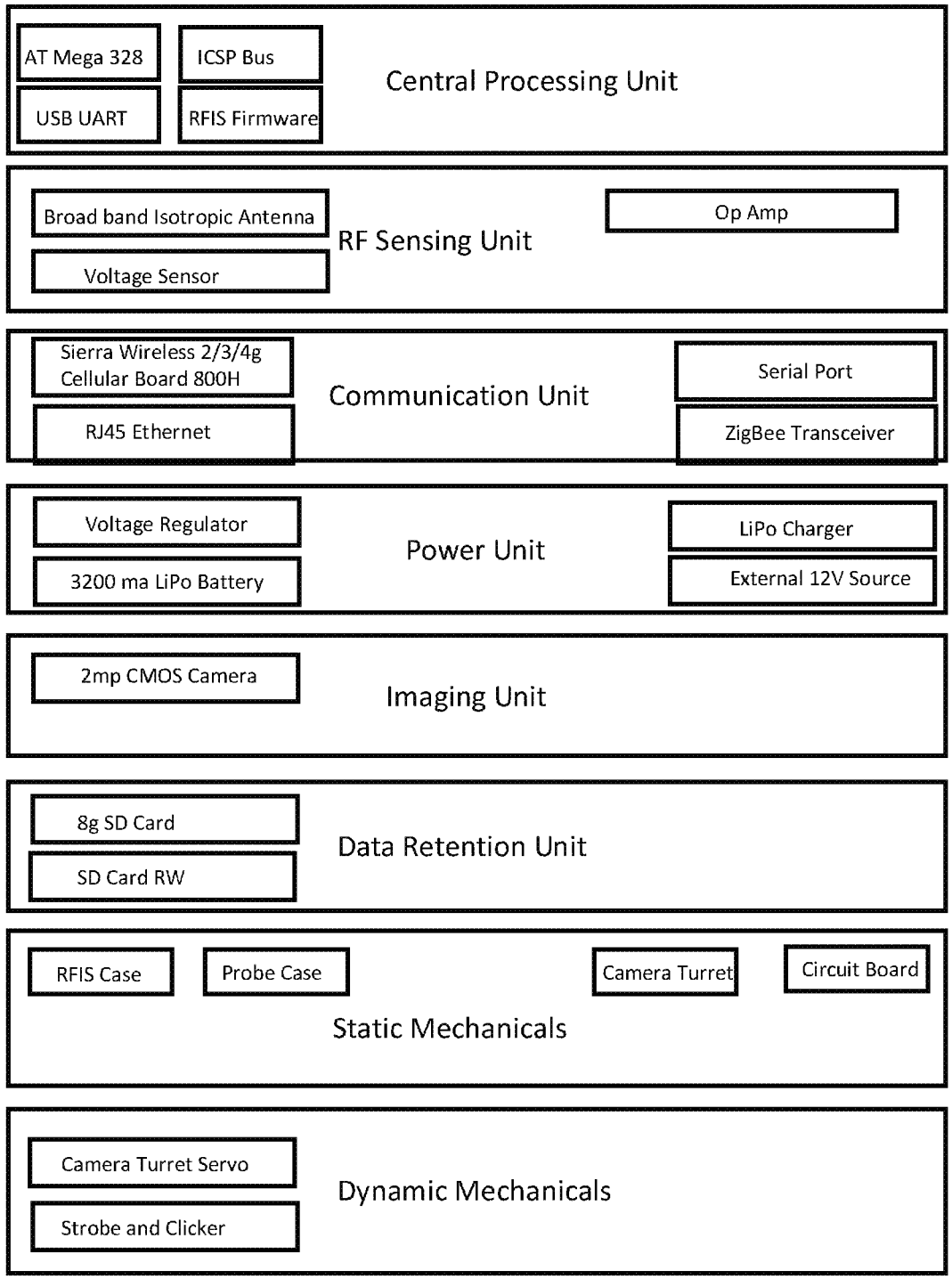
FIG. 21 illustrates a block diagram of the field unit components of the system.

FIG. 21 illustrates a block diagram showing in greater detail of the field unit components of the system. In this regard, the central processing unit of the field unit can include, e.g., an AT Mega 328 card, a ICSP bus, a USB UART, and RFIS firmware. The RF sensing unit can include, e.g., a broad band isotropic antenna, a voltage sensor and op amp. The communications unit includes, e.g., a Sierra wireless 2/3/4g cellular board 800H, RJ45 Ethernet plugs, serial ports and a ZigBee transceiver. The power unit can include, e.g., a voltage regulator, a 3200ma LiPo battery, a LiPo charger and an external 12V source. The imaging unit can include, e.g., a 2mp CMOS camera. The data retention unit can include, e.g., an 8 g SD card and an SD card RW. The static mechanicals can include, e.g., the RFIS case, the probe case, the camera turret and circuit board. The dynamic mechanicals can include, e.g., a camera turret servo and a strobe and clicker.

Figure 22:
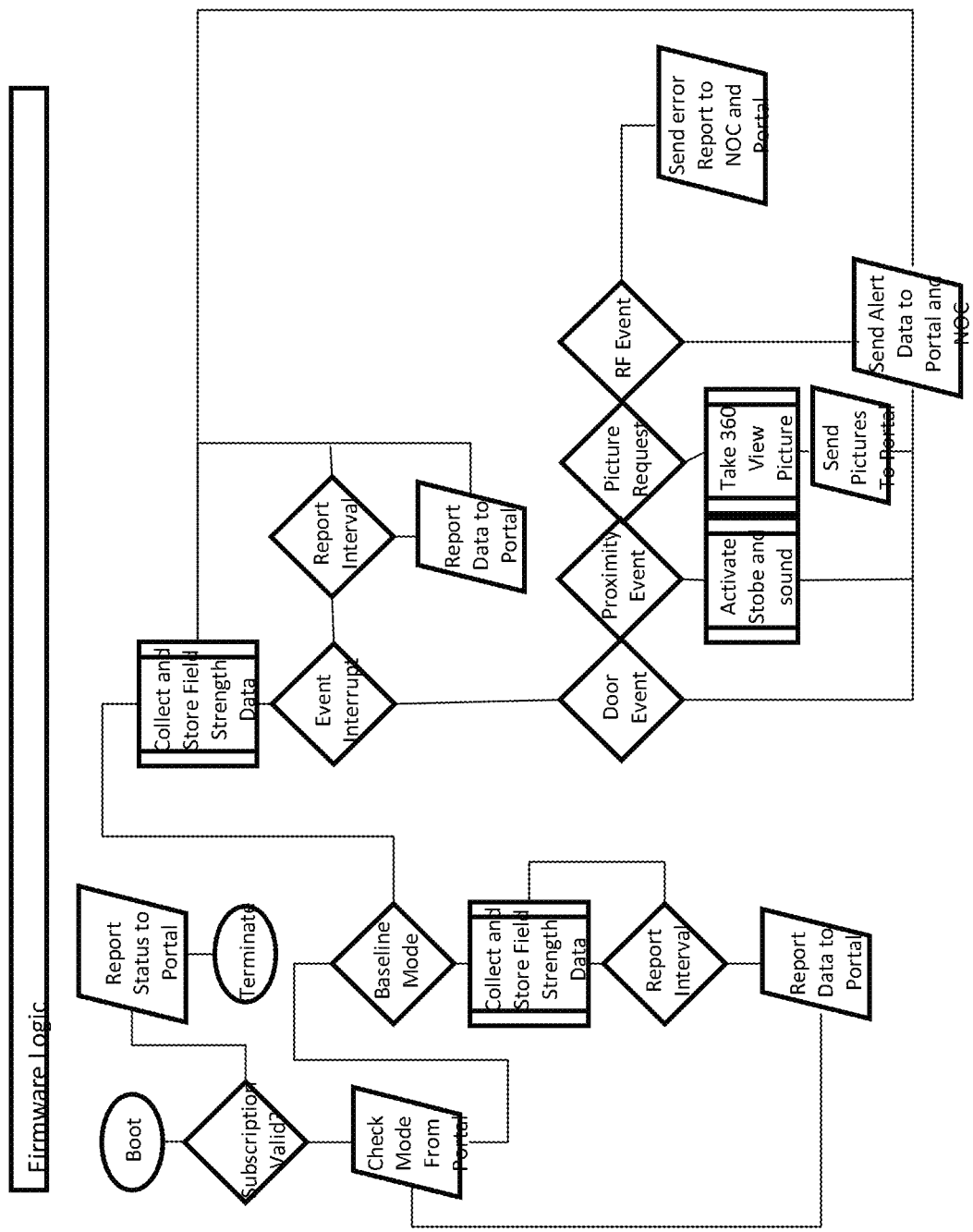
FIG. 22 illustrates an embodiment of exemplary firmware logic for the field unit.

FIG. 22 illustrates a flow diagram for an exemplary embodiment of firmware logic for the field unit. In the exemplary flow diagram can begin with booting-up the RF antenna sector monitoring system components and then determining whether the field unit has a valid subscription. If the subscription is invalid, the condition is reported to the portal and the service is terminated. If the subscription is valid, the portal checks whether the system is operating properly. The RF monitoring system can operate in a baseline mode, where RF measurements are taken to establish a baseline RF level. The baseline RF level and regular RF field strength data is collected and stored in memory and this information can be transmitted to the portal at regular intervals.

The process also includes monitoring for interrupt events, such as a door event, a proximity event, a picture request and an RF event. In particular, when the access door near the monitored sector is opened, an alert is sent to the portal and the NOC notifying them of the door event. When an object is moved too close to the monitored sector, a visible and/or audible alarm is activated and an alert is sent to the portal and the NOC notifying them of the proximity event. A picture request can be made by the portal user to take 360° panoramic pictures to see the current state of the monitored sector. The pictures can be transmitted with an alert to the portal and the NOC. Further, in addition to merely collecting and storing RF field strength data, the collected and stored RF field strength data is analyzed to determine whether the measured RF level exceeds the baseline RF level by a predefined amount for a predetermined period of time. If such a determination is made, the occurrence is reported to the portal and the NOC as an alert.

Figure 23:
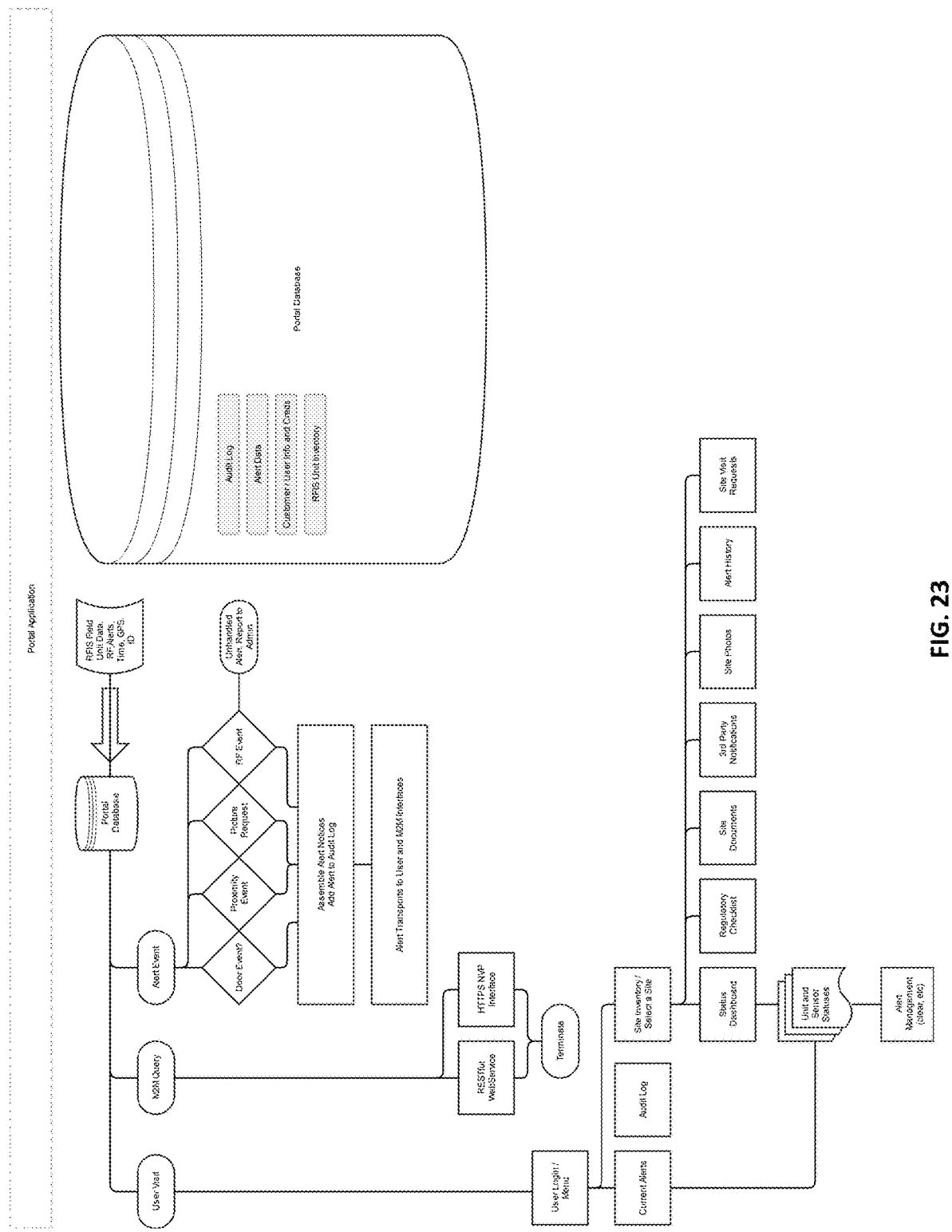
FIG. 23 illustrates an embodiment of a flow diagram of an exemplary operation of the portal system.

FIG. 23 illustrates an embodiment of a flow diagram of an exemplary operation of the portal application. The portal application is a cloud based software platform for facilitating and coordinating all of the various capabilities and functions of the RFIS system. The portal application is the processing entity which manipulates, enters and removes data from the portal database. The portal application controls all of the system components including security, internal communications, external communications and application programming interfaces (APIs), site documents, baselines, alerts and audit logs. The portal application interfaces include a website for user functions: user management, audit logs, site inventory, site details and documents, and the viewing of individual RFIS unit data. The portal application interfaces also include a M2M (machine to machine) interface through which the RFIS units communicate with the portal application for non alert communications and external systems (network operation centers, email, etc) for the purpose of transmitting alerts to same. The portal application interfaces also include a direct, encrypted, internet protocol interface through which the RFIS units communicate with the portal application to instantiate system alerts and to accept portal requests for photos.

Figure 24:
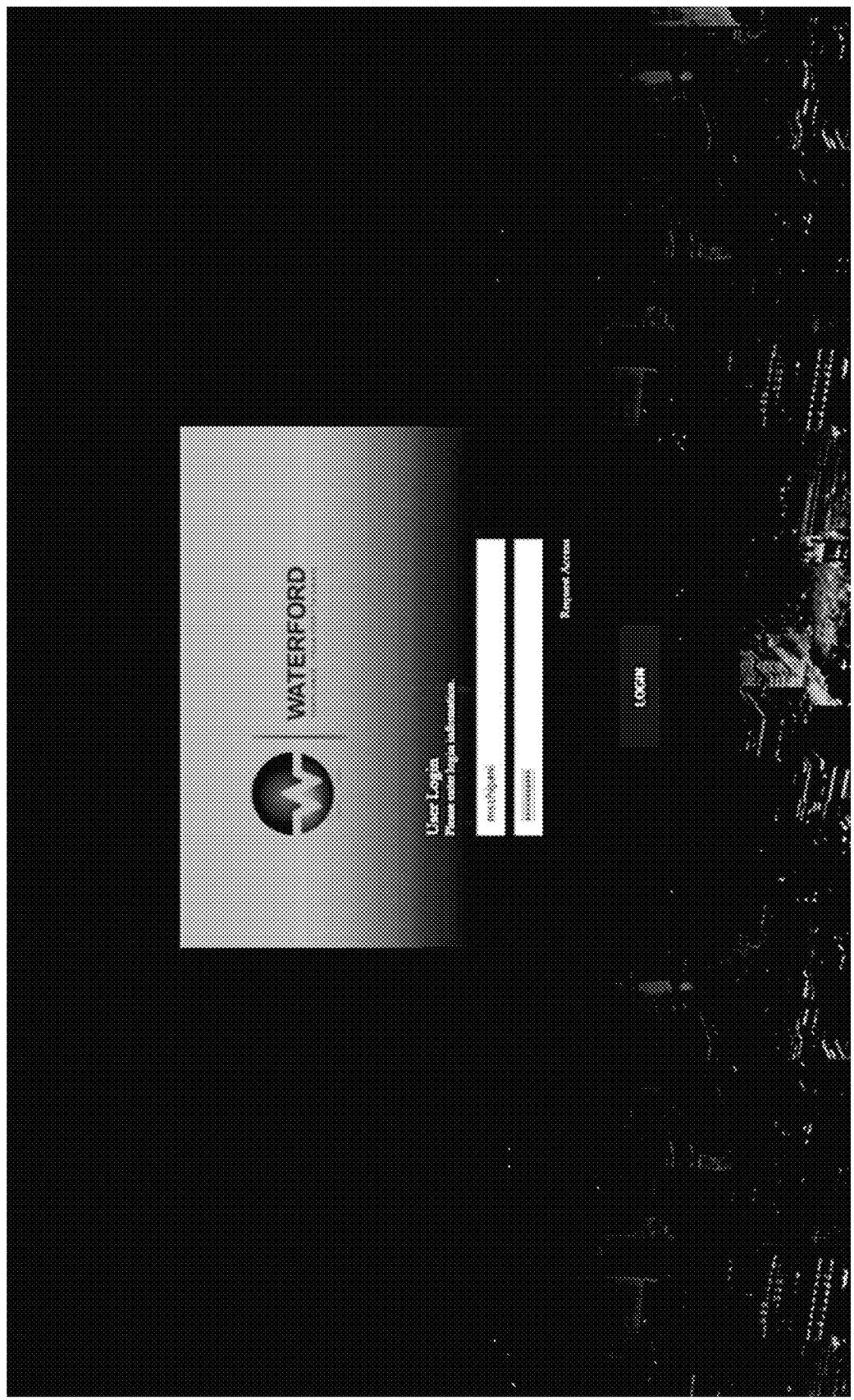
FIGS. 24-27 illustrate screen shots of a user's display of the operating portal system.
Figure 25:
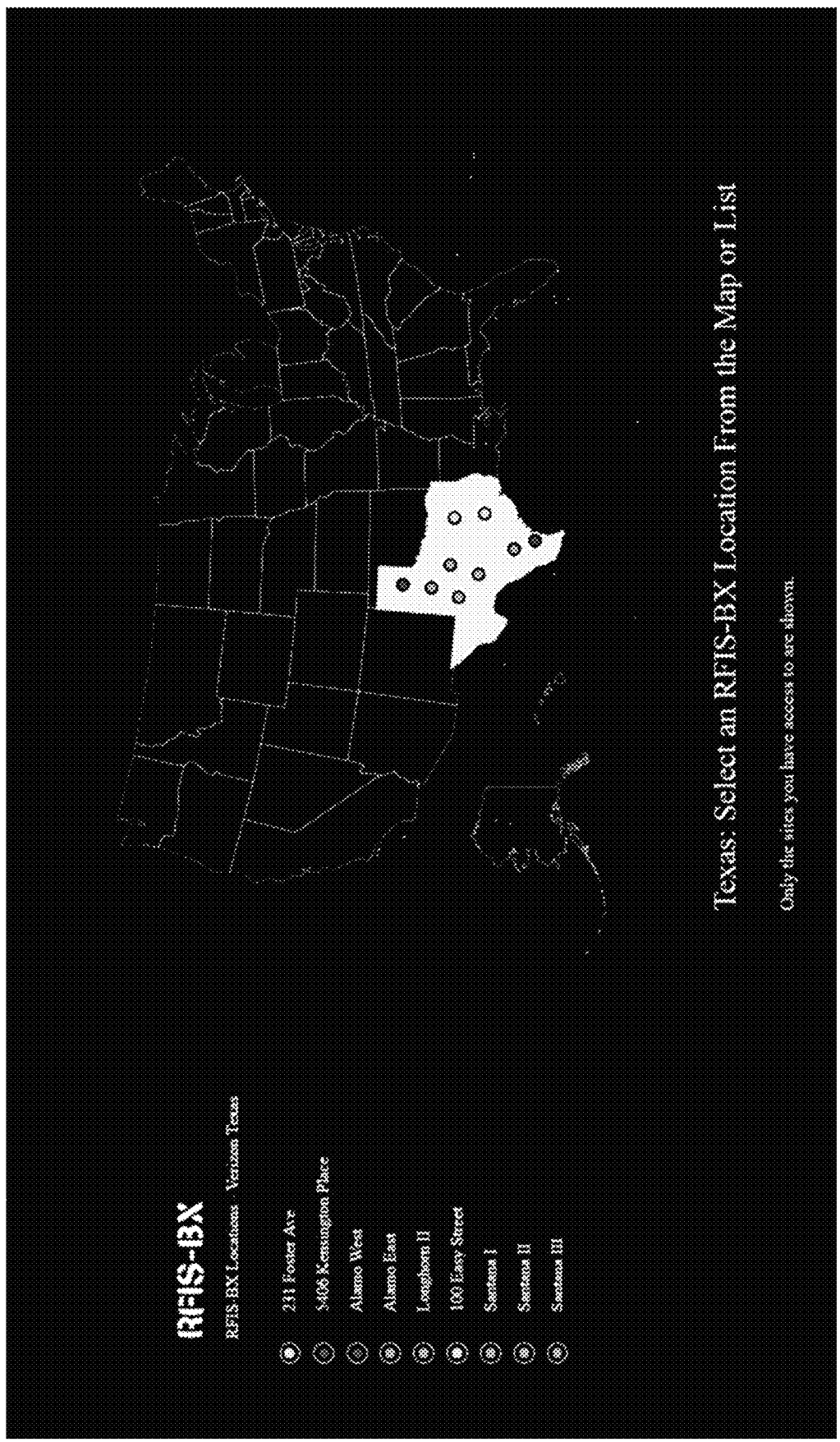
Figure 26:
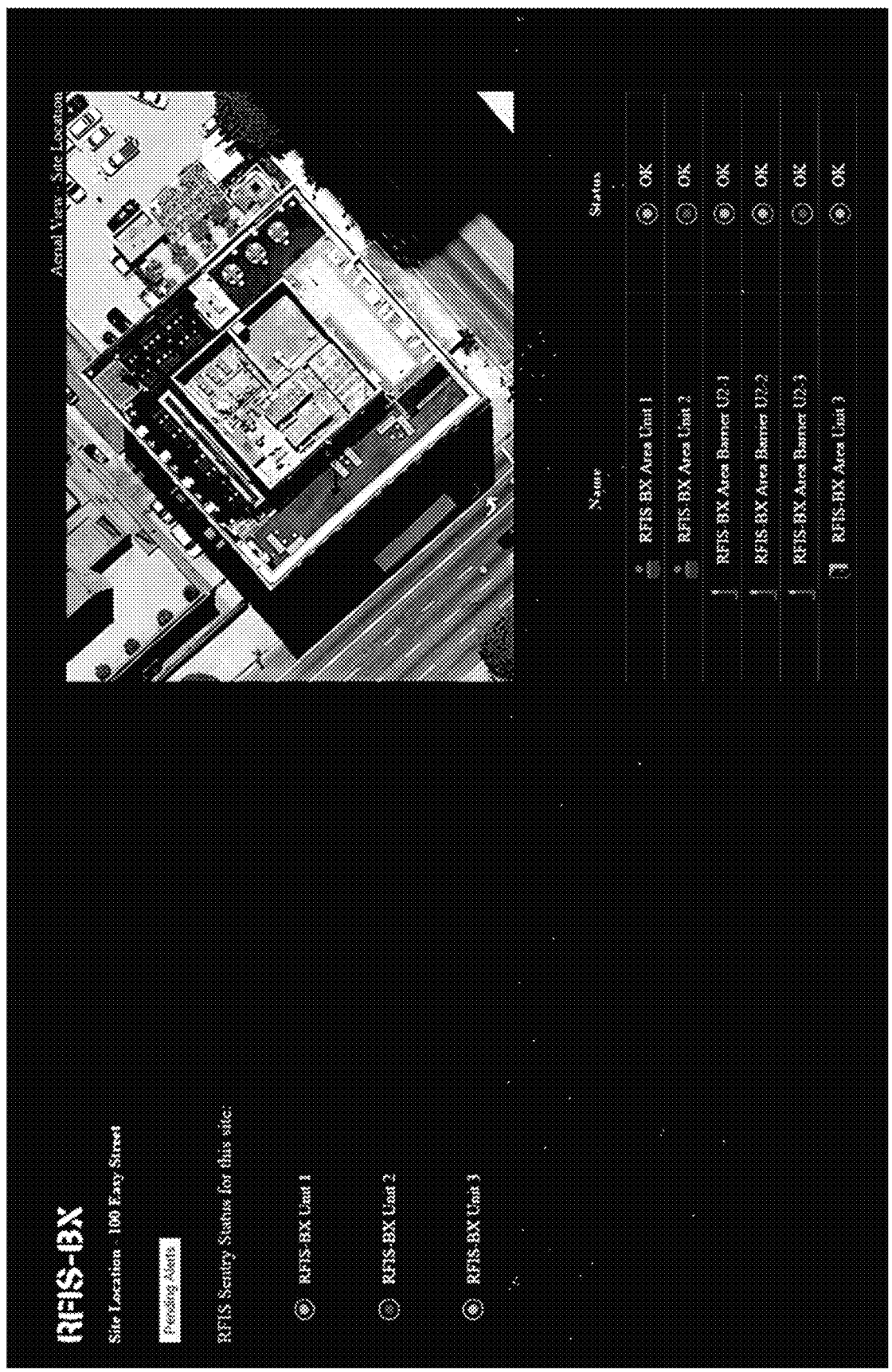
Figure 27:
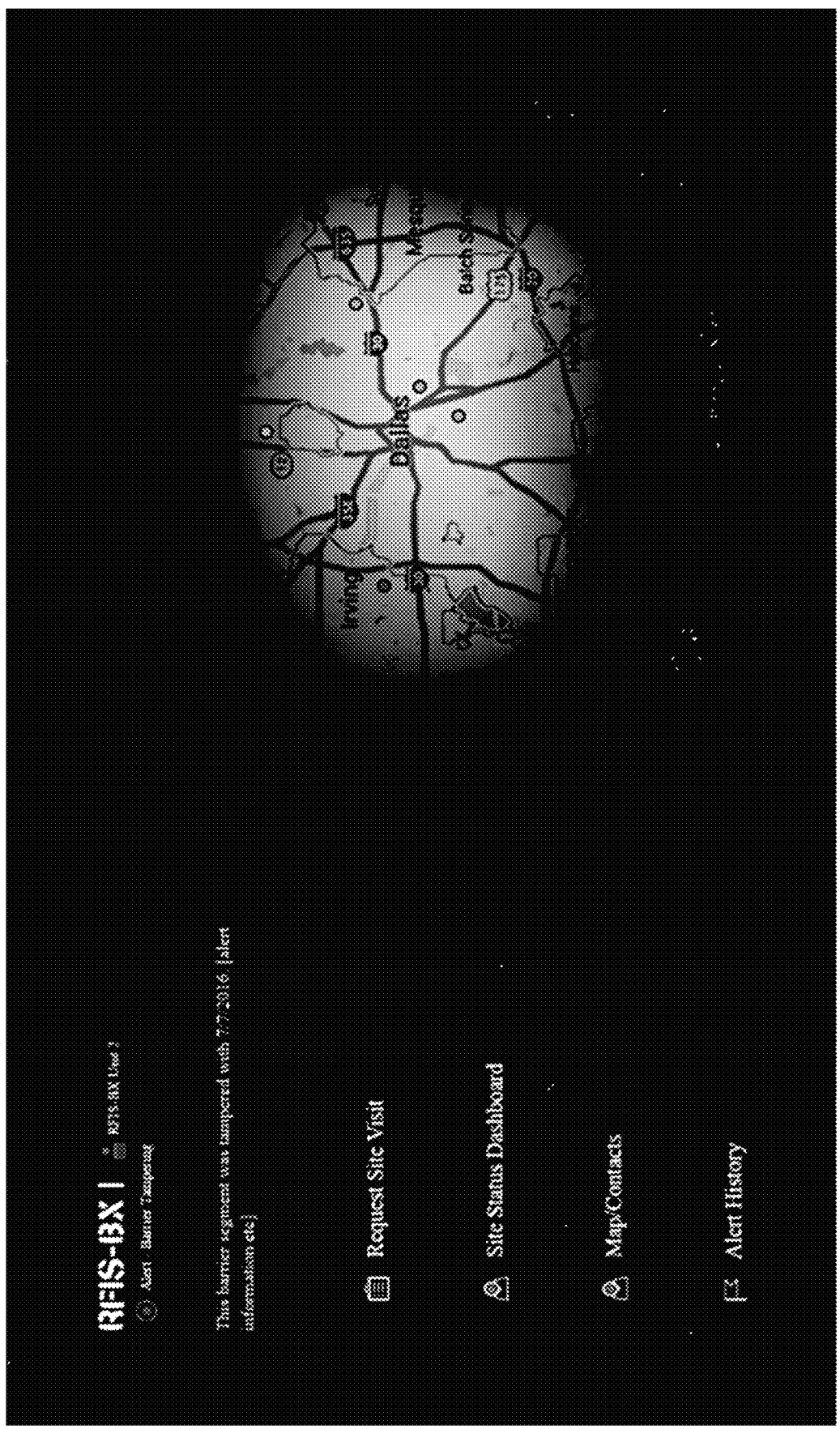

Further, FIGS. 24-27 illustrate screen shots of a user's display of the operating portal system. FIG. 24 shows a user login web page for accessing the portal. FIG. 25 shows a map displaying monitored sector site locations associated with the logged-in user. The user can access information about each site by selecting a designated site on the map or by selecting one of the locations in the list on the left-hand side of the web page. After a desired site has been selected, FIG. 26 shows, e.g., an aerial view of the monitored sector, but it is understood that the view could likewise be taken from another angle. Further, FIG. 26 identifies the status of the monitored system components, such as access doors, barrier and signage, as well as pending alerts. FIG. 27 shows a dashboard from which the portal user can navigate the portal. From this page the user can request a site visit, access the web page for viewing user associated site information, view maps and contact the system administrator and access the alert history.

Figure 29:
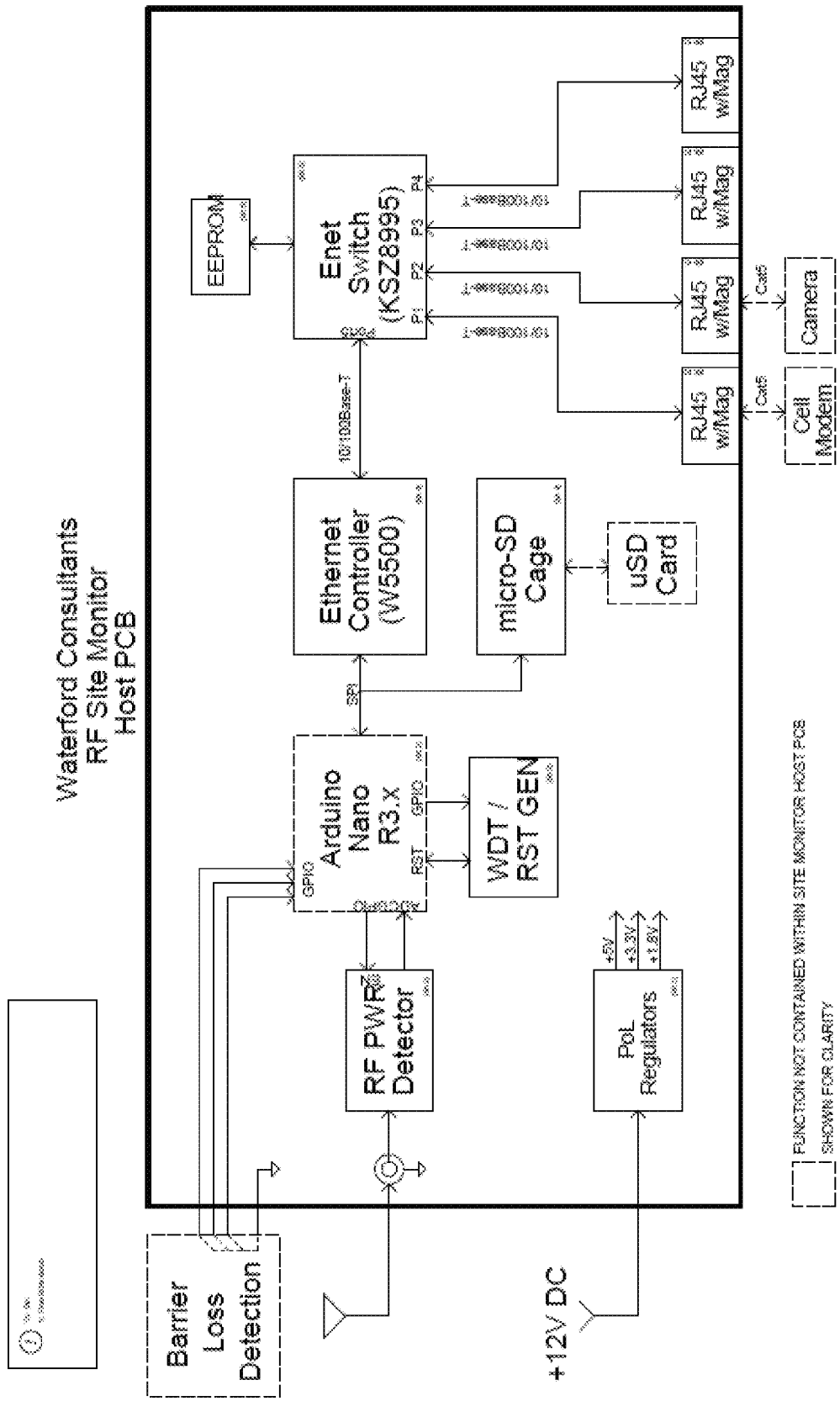
FIG. 29 shows a printed circuit board for use with the primary field unit.

FIG. 29 illustrates an exemplary printed circuit board for use with the primary field unit. The printed circuit board can be multilayer laminate board. A power input, e.g., a 12V dc source can be coupled to a switching regulator. Moreover, linear regulators can be coupled to the switching regulator. The printed circuit board can include a compact board, e.g., an Arduino Nano R3.x. Further, a barrier loss detection circuit is external to the printed circuit board and coupled to the compact board. An RF power meter can be coupled to the compact board and to the RF receiver. A watchdog timer/reset generator is connected to the compact board to, e.g., monitor the time period for which an RF measurement exceeds the RF baseline by a predefined amount. An Ethernet controller is coupled to the compact board and to an Ethernet switch. Moreover, the Ethernet switch can be connected to an electrically erasable programmable read-only memory (EEPROM). The Ethernet switch is also connected to a number of plugs, e.g., RJ45 plugs, via the magnetics for switch ports, which can be configured in the manner shown in FIG. 42. By way of example, a cell modem, a camera and/or other auxiliary devices can be coupled to the printed circuit board via the RJ45 plugs.

In embodiments, the system components can be configured to provide 2G, 3G or 4G/LTE compatibility; a central processing unit; location ID via GPS; RF monitoring and detection; alert communication with NOC of changes in RF environment; camera for "on-demand" photos of signage; and barrier sensors w/alert communication. In this way, the system can enhance a carrier's ability to ensure FCC compliance through the following features: 24/7 automated monitoring with 2G, 3G or 4G/LTE compatibility; customer web portal with shared dashboard; immediate alert notification when changes in the RF environment occur; facilitates immediate remediation capability and eliminates potential for out-of-compliance or at-risk scenario; barrier sensors facilitate notification of barrier tipping, removal or relocation; threaded mounting allows installation on tripod, sled mount, etc.; "on demand" photos of RF safety signage taken from customer portal; significant annual cost-savings versus traditional annual audit process; weather-tight, heavy duty construction to withstand wide variety of climate conditions and temperature ranges; and FCC compliance guaranteed for 3 years with service subscription.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. An FCC compliance system for monitoring FCC compliance of regulations and guidelines pertaining to radio frequency (RF) emissions at a transmission site, where the transmission site includes at least one sector having at least one RF antenna and mitigations that include a barrier that at least partially surrounds the sector, the barrier having a plurality of barrier elements, the system comprising:
   at least one tangible, non-transitory storage medium storing a set of instructions for operating the FCC compliance system;
   a processor for executing the set of instructions stored on the memory;
   a probe unit, mounted behind the at least one RF antenna, comprising a primary RF probe to measure RF emissions of the at least one RF antenna of the sector;
   an RF sensor unit coupled to the processor to transmit data of the RF emissions measured by the primary RF probe;
   a transceiver arranged to transmit a first alert to a user of current RF emission measurements that have changed from a predetermined baseline measurement by a predetermined amount for a predetermined period of time; and
   a receiver electrically connectable to each of a plurality of barrier sensors to receive a signal from each of the plurality of barrier sensors in order to monitor the barrier for disturbances of any of the barrier elements,
   wherein the transceiver is further arranged to transmit a second alert to the user of the disturbance of any of the barrier elements, and
   wherein the baseline measurement is established by the probe unit measuring RF emissions behind the RF antenna over a predetermined learning period.

2. The FCC compliance system according to claim 1, further comprising a secondary RF probe mounted in front of the at least one RF antenna and coupled to the probe unit.

3. The FCC compliance system according to claim 1, further comprising a portal system remote from the probe unit, wherein the transceiver is configured to transmit at least one of the first or second alerts to the user via the portal system and to receive at least alert resets from the user via the portal system.

4. A method for monitoring FCC compliance of regulations and guidelines pertaining to radio frequency (RF) emissions at a transmission site, where the transmission site includes a sector having at least one RF antenna, at least a probe unit and mitigations that include a barrier that at least partially surrounds the sector with a plurality of barrier elements, the method comprising:

measuring, from a location behind the at least one RF antenna and over a predetermined learning period, RF emissions of the at least one RF antenna to establish a baseline measurement for an RF emission environment for the at least one RF antenna of the sector;

measuring, after the predetermined learning period, current RF emissions of the at least one RF antenna of the sector and comparing the current RF emission measurements to the baseline measurement to determine whether the current RF emission measurements have changed from the baseline measurement by a predetermined amount for a predetermined period of time;

monitoring each of the plurality of barrier elements for a disturbance of any of the plurality barrier elements, wherein the disturbance comprises at least one of a tipping, removal or relocation of any of the plurality of barrier elements; and alerting a user of at least of a first or a second alert condition, where the first alert condition is of the current RF emission measurements changing from the baseline measurement by the predetermined amount for the predetermined period of time and the second alert condition is of the disturbance of any of the plurality of barrier elements.

5. The method according to claim 4, further comprising measuring RF emissions from a location in front of the at least one antenna to establish a front baseline measurement.

6. The method according to claim 4, further comprising transmitting at least the first or second alerts to a portal system remote from the probe unit and receiving at least first or second alert resets from the portal system.

7. The method according to claim 6, wherein the first alert is transmitted to a user through the portal system; and
the first alert is cleared by the user through the portal system.

8. The method according to claim 6, wherein the second alert is transmitted to a user through the portal system; and
the second alert is cleared by the user through the portal system.

9. The method according to claim 4, wherein the first alert condition is of the current RF emission measurements that have changed from the baseline measurement by an amount determined during a baseline process.

10. The method according to claim 4, wherein the first alert condition is of the current RF emission measurements that have changed from the baseline measurement by a period of time determined during a baseline process.

11. The system according to claim 1, wherein the disturbances comprise at least one of a tipping, removal or relocation of any of the plurality of barrier elements.

* * * * *